(12) United States Patent
Elsasser et al.

(10) Patent No.: US 10,638,634 B1
(45) Date of Patent: Apr. 28, 2020

(54) RACK-MOUNTABLE ASSEMBLY WITH ELECTROMAGNETIC SHIELDING STRUCTURE(S)

(71) Applicant: INTERNATIONAL BUSINESS MACHINES CORPORATION, Armonk, NY (US)

(72) Inventors: Ryan Elsasser, Poughkeepsie, NY (US); William Risk, San Jose, CA (US); Camillo Sassano, Durham, NC (US); Matthew Butterbaugh, Rochester, MN (US); Michael Good, Fountain, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/448,144

(22) Filed: Jun. 21, 2019

(51) Int. Cl.
*H05K 7/14* (2006.01)
*H05K 9/00* (2006.01)
*H05K 7/16* (2006.01)

(52) U.S. Cl.
CPC ......... *H05K 7/1487* (2013.01); *H05K 7/1489* (2013.01); *H05K 7/16* (2013.01); *H05K 9/0016* (2013.01); *H05K 9/0062* (2013.01)

(58) Field of Classification Search
CPC ... H05K 9/0062; H05K 7/1489; H05K 9/0016
See application file for complete search history.

(56) References Cited

U.S. PATENT DOCUMENTS

| 3,711,053 | A | | 1/1973 | Drake |
| 4,999,459 | A | | 3/1991 | Smith et al. |
| 6,023,415 | A | | 2/2000 | Mayer et al. |
| 6,080,930 | A | * | 6/2000 | Lommen ............ H05K 9/0016 174/355 |

(Continued)

OTHER PUBLICATIONS

Crippen et al., "EMC Design of an Electronic Processing System Mounted in a Standard EIA Rack", IBM Publication, IP.com No. IPCOM000036377D, Published Jan. 29, 2005 (3 pages).

(Continued)

*Primary Examiner* — Hung V Ngo
(74) *Attorney, Agent, or Firm* — Tihon Poltavets, Esq.; Kevin P. Radigan, Esq.; Heslin Rothenberg Farley & Mesiti P.C.

(57) ABSTRACT

Rack-mountable assemblies are provided which include a cover configured to fixedly mount to a frame of an electronics rack, and a drawer configured to slidably mount to the frame adjacent to the cover to slide relative to the cover. When operatively mounted to the frame, the cover and drawer together define an enclosure for one or more electronic components. The assembly further includes an electromagnetic shielding structure to provide, at least in part, electromagnetic shielding at a gap between the cover and drawer when operatively positioned within the electronics rack. The electromagnetic shielding structure includes an electromagnetic shielding plate which overlies, at least in part, the gap between the cover and the drawer, and which self-adjusts with sliding of the drawer into the electronics rack to facilitate providing the electromagnetic shielding at the gap between the cover and the drawer.

20 Claims, 19 Drawing Sheets

(56) References Cited

U.S. PATENT DOCUMENTS

| | | | |
|---|---|---|---|
| 6,285,548 B1 * | 9/2001 | Hamlet | H05K 7/1461 |
| | | | 174/15.1 |
| 6,442,030 B1 | 8/2002 | Mammoser et al. | |
| 6,560,114 B2 | 5/2003 | Berry et al. | |
| 6,566,973 B2 * | 5/2003 | Schumacher | H05K 7/1449 |
| | | | 333/12 |
| 6,590,784 B2 | 7/2003 | Wortman et al. | |
| 6,744,641 B2 | 6/2004 | Schnabel | |
| 6,839,237 B2 | 1/2005 | Berry et al. | |
| 7,013,558 B2 | 3/2006 | Bachman | |
| 7,214,888 B1 | 5/2007 | Feroli et al. | |
| 7,262,972 B1 * | 8/2007 | Gundogan | H05K 9/0062 |
| | | | 361/726 |
| 7,298,624 B2 | 11/2007 | Boswell et al. | |
| 7,388,754 B2 | 6/2008 | Chen | |
| 7,656,681 B2 * | 2/2010 | Tracewell | H05K 7/20563 |
| | | | 361/800 |
| 7,705,248 B2 * | 4/2010 | Loeffelholz | H05K 9/0062 |
| | | | 174/377 |
| 7,857,267 B2 | 12/2010 | Watts | |
| 7,969,748 B2 | 6/2011 | Niederkorn et al. | |
| 7,990,726 B2 * | 8/2011 | Izuhara | H05K 9/0062 |
| | | | 165/80.4 |
| 9,095,045 B2 * | 7/2015 | Rojo | H04Q 1/112 |
| 9,124,956 B2 * | 9/2015 | Heimann | H04Q 1/10 |
| 9,313,935 B2 * | 4/2016 | Soo Hoo | H05K 7/1491 |
| 9,462,732 B2 | 10/2016 | Robinson et al. | |
| 10,058,005 B1 | 8/2018 | Willard | |
| 2008/0037203 A1 | 2/2008 | Wayman | |
| 2008/0080158 A1 * | 4/2008 | Crocker | H05K 9/0062 |
| | | | 361/818 |
| 2008/0135705 A1 | 6/2008 | Chuang | |
| 2012/0229987 A1 * | 9/2012 | Peng | H05K 7/1488 |
| | | | 361/724 |
| 2013/0115869 A1 | 5/2013 | Alshinnawi et al. | |
| 2014/0021154 A1 | 1/2014 | Chen | |
| 2014/0042883 A1 * | 2/2014 | Lin | H05K 5/0004 |
| | | | 312/223.1 |

OTHER PUBLICATIONS

Anonymous, "Enhanced Frame Assembly with Separable Central Electronic Complex Cage Structure", IBM Publication, IP.com No. IPCOM000229483D, Published Jul. 31, 2013 (9 pages).

Grace Period Disclosure: O'Brien, Jeremy W., "AFRL, IBM Unveil World's Largest Neuromorphic Digital Synaptic Super Computer", Air Force Research Laboratory Information Directorate, published Jul. 24, 2018, at: https://www.wpafb.af.mil/News/Article-Display/Article/1582310/afrl-ibm-unveil-worlds-largest-neuromorphic-digital-synaptic-super-computer/ (1 page).

DL Custom, "Wall Mount Brackets", Online Product Brochure, https://www.dlcustom.com/wp-content/uploads/2018/05/42.pdf, downloaded on Mar. 18, 2019 (1 page).

* cited by examiner

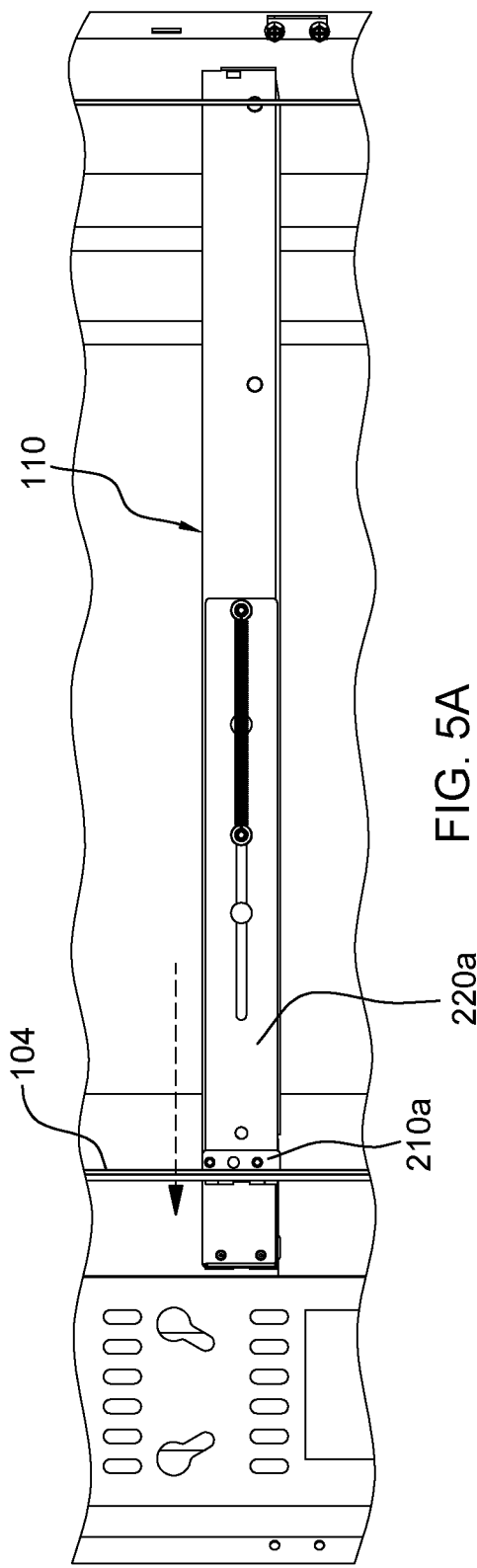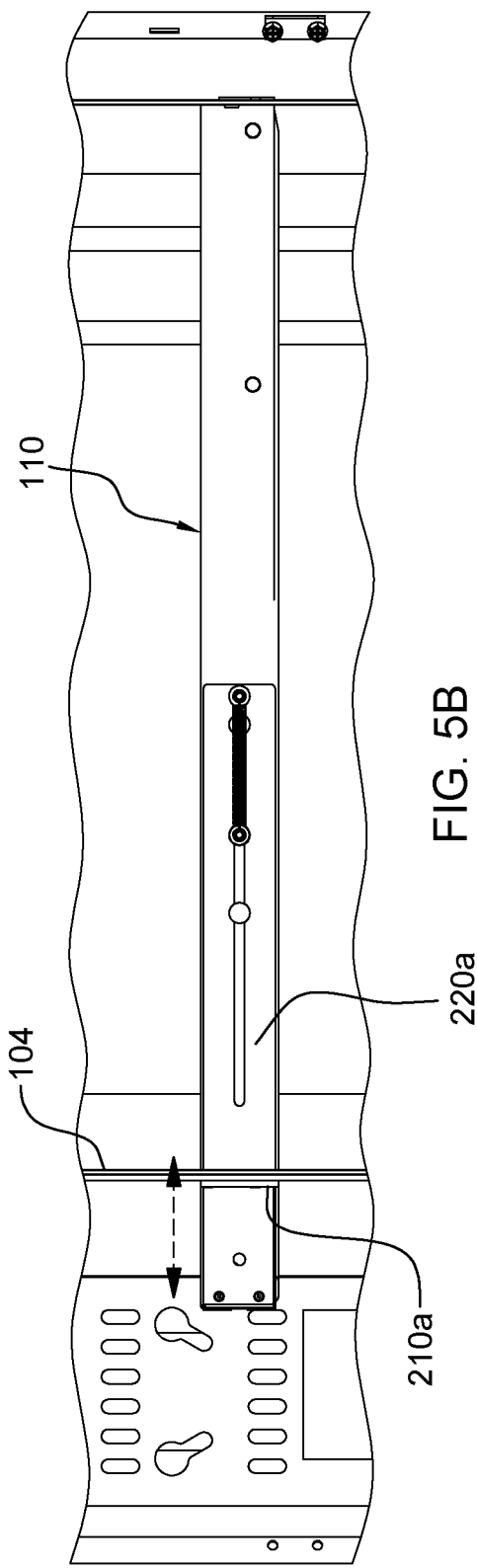

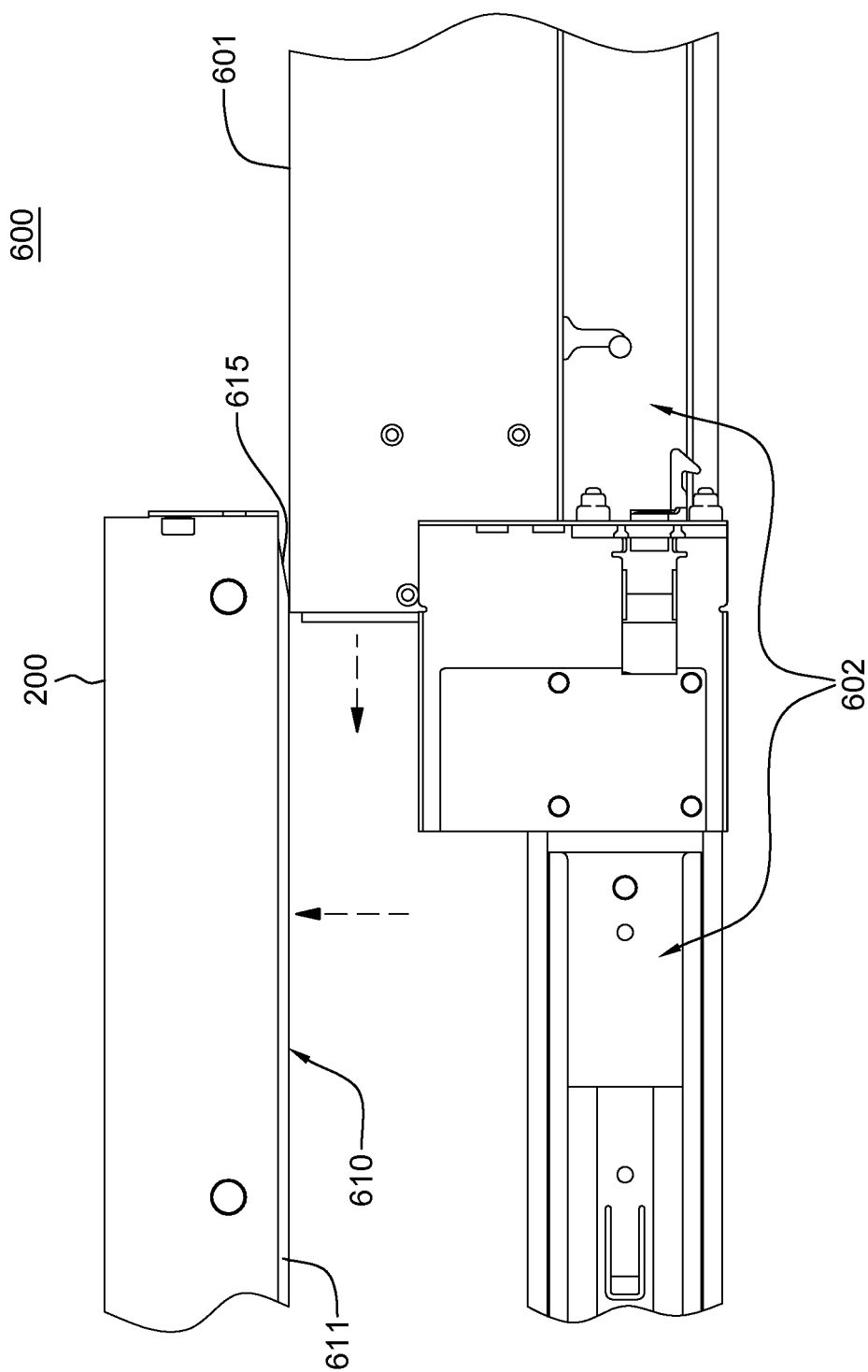

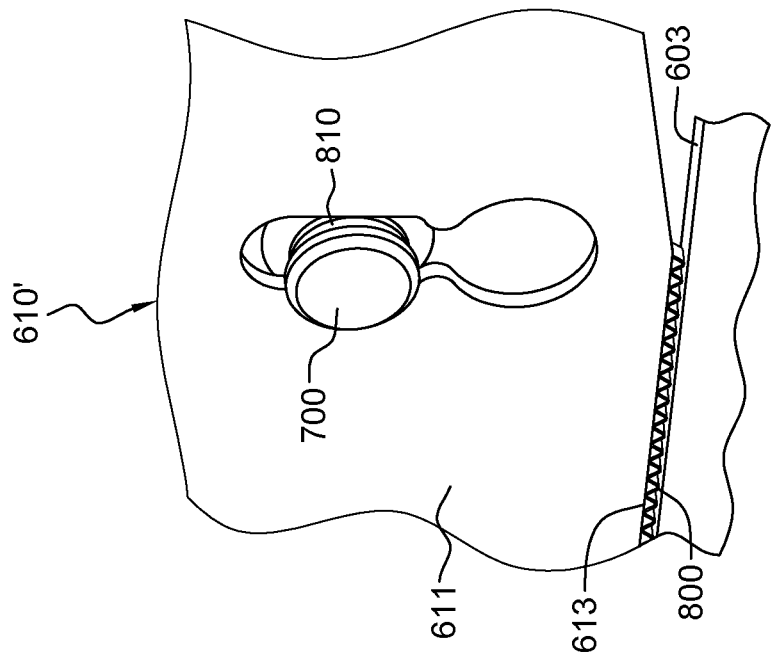
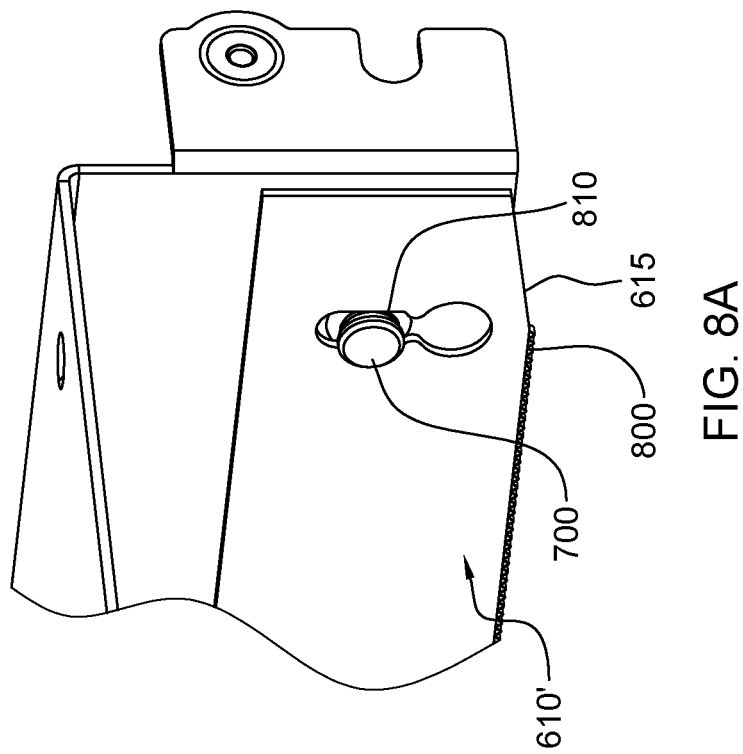
FIG. 8B
FIG. 8A

RACK-MOUNTABLE ASSEMBLY WITH ELECTROMAGNETIC SHIELDING STRUCTURE(S)

STATEMENT REGARDING FEDERALLY SPONSORED RESEARCH OR DEVELOPMENT

This invention was made with Government support under Contract Number FA8750-17-C-0097, awarded by the United States Air Force (USAF). The Government has certain rights to this invention.

STATEMENT REGARDING PRIOR DISCLOSURES

The following disclosure is submitted under 35 U.S.C. § 102(b)(1)(A):

DISCLOSURE(S): "AFRL, IBM Unveil World's Largest Neuromorphic Digital Synaptic Super Computer", by Jeremy W. O'Brien, Air Force Research Laboratory Information Directorate, published Jul. 24, 2018, at: https://www-.wpafb.af.mil/News/Article-Display/Article/1582310/afrl-ibm-unveil-worlds-largest-neuromorphic-digital-synaptic-super-computer/(1 page).

BACKGROUND

In many computer applications, including information technology (IT) applications, processors, along with their associated electronics (e.g., memory, disk drives, power supplies, etc.), are packaged in electronic component chassis or drawer configurations stacked within an electronics rack or frame. An electronic component drawer, such as a server drawer, can be removable from the computer rack, or in a fixed location within the rack.

As circuit density of electronic devices continues to increase in order to achieve faster and faster processing speeds, there is corresponding demand for circuit devices to be packed more closely together. Each new generation of processors and associated electronics continues to offer increased speed and function. In many cases, this is accomplished, in part, by increased packaging density. The net result has been increased circuit density at all levels of packaging, including at the chassis or drawer level. This increased packaging density continues to require enhancements to chassis-level designs, and associated structures.

SUMMARY

Certain shortcomings of the prior art are overcome and additional advantages are provided through the provision, in one or more aspects, of a rack-mountable assembly which includes a cover, a drawer, and an electromagnetic shielding structure. The cover is configured to fixedly mount to a frame of an electronics rack, and the drawer is configured to slidably mount to the frame of the electronics rack adjacent to the cover to slide relative to the cover. When operatively mounted to the frame of the electronics rack, the cover and drawer together define an enclosure to enclose one or more electronic components. The electromagnetic shielding structure provides, at least in part, electromagnetic shielding at a gap between the cover and the drawer when the cover and drawer are operatively positioned within the electronics rack. The electromagnetic shielding structure includes an electromagnetic shielding plate. The electromagnetic shielding plate overlies, at least in part, the gap between the cover and the drawer, and self-adjusts with sliding of the drawer into the electronics rack to facilitate providing the electromagnetic shielding at the gap between the cover and the drawer.

In another aspect, an apparatus is provided which includes an electronics rack and a rack-mounted assembly. The electronics rack includes a frame, and the rack-mounted assembly includes a cover, a drawer, and an electromagnetic shielding structure. The cover is fixedly mounted to the frame of the electronics rack, and the drawer is slidably coupled to the frame of the electronics rack adjacent to the cover to slide relative to the cover. Together, the cover and drawer define an enclosure to enclose one or more electronic components. The electromagnetic shielding structure provides, at least in part, electromagnetic shielding at a gap between the cover and the drawer when operatively positioned within the electronics rack. The electromagnetic shielding structure includes an electromagnetic shielding plate. The electromagnetic shielding plate overlies, at least in part, the gap between the cover and the drawer, and self-adjusts with sliding of the drawer into the electronics to facilitate providing the electromagnetic shielding at the gap between the cover and the drawer.

In a further aspect, a method is provided which includes providing a rack-mountable assembly for an electronics rack. Providing the rack-mountable assembly includes providing a cover to fixedly mount to a frame of the electronics rack, and providing a drawer configured to mount to the frame of the electronics rack adjacent to the cover to slide relative to the cover. When operatively positioned within the electronics rack, the cover and drawer together define an enclosure to enclose one or more electronic components. Providing the rack-mountable assembly further includes providing an electromagnetic shielding structure to provide, at least in part, electromagnetic shielding at a gap between the cover and the drawer when the cover and drawer are operatively positioned within the electronics rack. The electromagnetic shielding structure includes an electromagnetic shielding plate. The electromagnetic shielding plate overlies, at least in part, the gap between the cover and the drawer, and self-adjusts with sliding of the drawer into the electronics rack to facilitate providing the electromagnetic shielding at the gap between the cover and the drawer.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 5A & 5B are elevational views of the cover of FIGS. 2A-4D being positioned within a frame of an electronics rack with the sliding member shown adjustable based on the location of the back vertical rail flange, to which the spring-hinged mounting bracket is to be affixed, in accordance with one or more aspects of the present invention;

FIG. 6C is a partial side elevational view of the rack-mountable assembly embodiment of FIGS. 6A-6B, showing the drawer sliding into position below the cover, and contacting an electromagnetic shielding structure depending from the cover, in accordance with one or more aspects of the present invention;

FIG. 8A is an enlarged, partial depiction of another embodiment of a rack-mountable assembly, including an electromagnetic shielding structure adjustably coupled to a cover, in accordance with one or more aspects of the present invention;

FIG. 8B is an enlarged depiction of the electromagnetic shielding structure of FIG. 8A in contact with an edge of a drawer of the rack-mountable assembly when the cover and drawer are operatively positioned within the electronics rack, in accordance with one or more aspects of the present invention;

DETAILED DESCRIPTION

Aspects of the present invention and certain features, advantages and details thereof, are explained more fully below with reference to the non-limiting example(s) illustrated in the accompanying drawings. Descriptions of well-known systems, devices, fabrication techniques, etc., are omitted so as not to unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of an apparatus or rack-mountable assembly, such as disclosed herein.

As noted, as circuit density of electronic devices continues to increase in order to achieve faster and faster processing speeds, there is a corresponding demand for devices to be packed more closely together, including within an electronics or computer rack, as well as within an electronic component chassis coupled to the rack. In one or more implementations, an electronic component chassis, such as a drawer, is a frame or other internal support structure on or within which one or more circuit board assemblies and/or other electronic devices or components are mounted. As one example, an electronic component chassis can be a server chassis, which can be a drawer configuration removable from an electronics rack, or mounted in a fixed location within the rack. Traditionally, an electronics rack is a metal frame structure used to hold various hardware devices, such as servers, hard disk drives, modems, and other electronic equipment. While racks are provided in many different shapes and sizes, a standard-sized rack established by the Electronics Industries Association (EIA) for use with computers and other electronic equipment is typically 19-inches or 23-inches wide.

Figure 1:
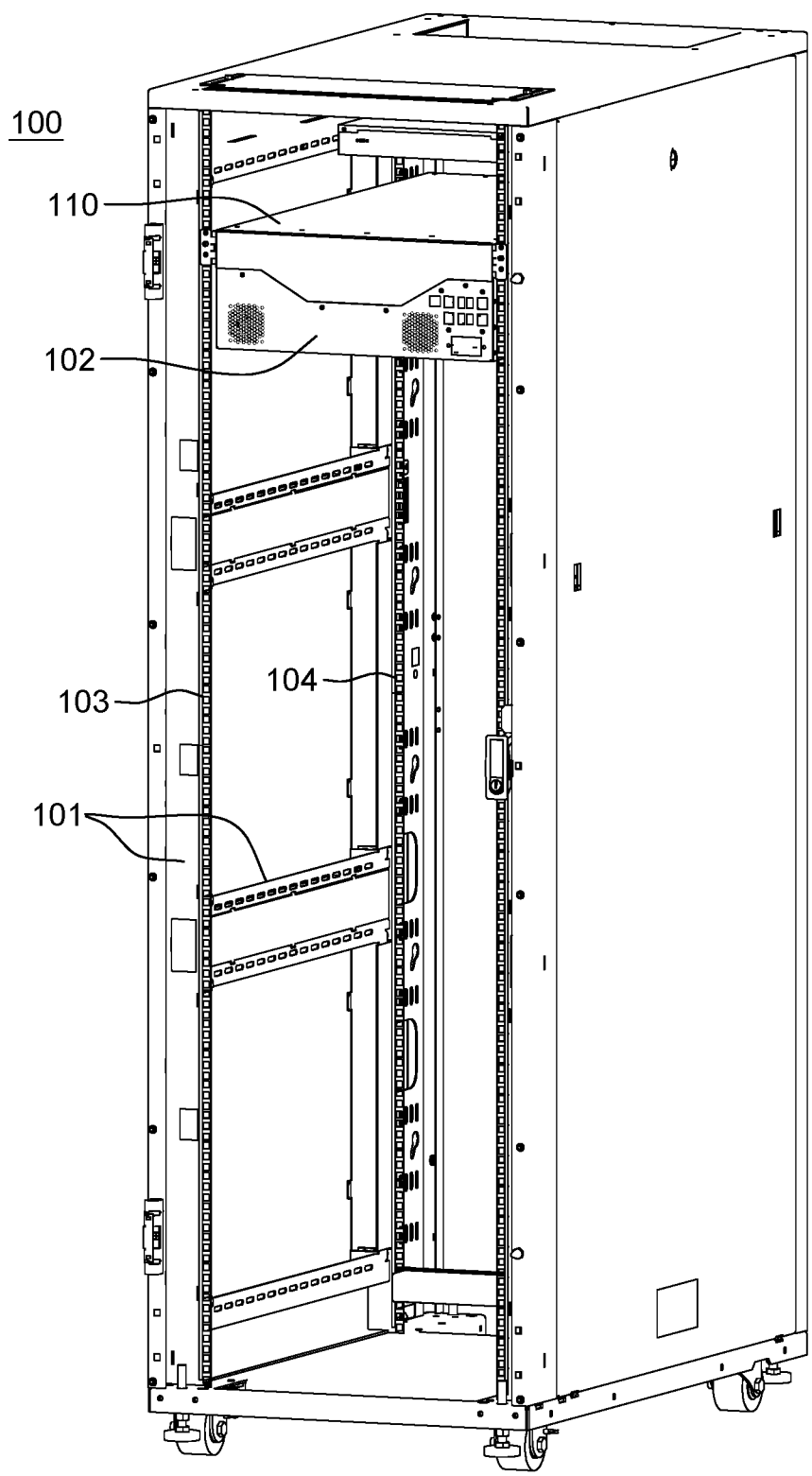
FIG. 1 depicts one embodiment of an electronics rack to accommodate one or more rack-mountable assemblies, in accordance with one or more aspects of the present invention.

By way of example, FIG. 1 depicts one embodiment of an EIA standard-width electronics rack 100, having multiple vertical and horizontal support rails 101. For instance, electronics rack 100 includes, in one or more embodiments, front vertical mounting rails 103 and rear vertical mounting rails 104, which include respective flanges for slidably coupling one or more drawers 102 to the frame of electronics rack 100. At least one drawer 102 can have associated therewith, a cover 110 fixedly mounted to the frame. In one or more embodiments, drawer 102 and the associated cover 110 are configured to form an enclosure about one or more circuit board assemblies and/or other electronic components disposed within drawer 102. Note that for purposes of illustration only, electronics rack 100 is substantially unpopulated in FIG. 1, with the exception of drawer 102 and cover 110.

Traditionally, a computer server drawer features a top cover that is rigidly latched to the drawer chassis, and the combination must be slid out of the server rack on slides before the top cover can be unlatched and removed from the server drawer. In certain data center applications, such a loose top cover can be a liability, or otherwise undesirable during service and/or maintenance of an electronics rack.

Addressing this concern, disclosed herein an electronic component chassis, or server drawer, which slides relative to a separate, rack-mounted, fixed cover. In this context, since a cover for, for instance, a 19-inch electronic component chassis is of a known, fixed width, and must interface with, for instance, traditional rigid, vertical mounting rail flanges within the rack, size restrictions and available space within the rack would prevent the cover from being moved directly into place into the server rack using only fixed-angle mounting brackets attached to the cover. This could especially be an issue during service and maintenance, where a populated rack could prevent the cover from being tilted for insertion into position within the rack or removal from the rack.

As a further issue, traditional, single-size rails for electronic component chassis, such as server drawers, and their associated covers, only fit customer racks that fall within a narrow window of depths, and are not sufficiently adaptable to customer racks of varying depths. Note in this regard that the depth at issue within the electronics rack refers to the location of the rear vertical mounting rails 104, and in particular, the mounting flanges associated therewith, relative to the front vertical mounting rails 103, where the structure is to mount within the electronics rack to the front and rear vertical mounting rails. For instance, the depth of the rear vertical mounting rail can be determined, for instance, from the front vertical mounting rail of the electronics rack, with the location of the rear vertical mounting rails varying, for instance, between different rack designs, and even between different standard 19-inch wide electronics rack designs.

Advantageously, disclosed herein is, in one or more embodiments, a single-piece, rack-mountable cover or cover assembly with adjustability features including, for instance, spring-hinged mounting brackets, and slidable members, such as spring-biased, telescoping, side-mounting surfaces. Since traditionally-sized computer racks are of standard width, the unique adjustability features allow the single-piece assembly to fit and fixedly mount within the frame, event where the depth of the rear mounting support rails varies, either within the same or between different racks.

Generally stated, disclosed herein in one aspect is an apparatus, or rack-mountable cover assembly, which includes a cover structure to be mounted to a frame of the electronics rack, and a spring-hinged mounting bracket associated with and extending from a side of the cover structure to facilitate mounting the structure to the frame. The spring-hinged mounting bracket facilitates insertion of the cover into the frame by pivoting inward towards the side of the structure upon the spring-hinged mounting bracket encountering an obstruction as the rack-mountable cover assembly is positioned within the frame for mounting to the frame.

In one or more embodiments, the rack-mountable cover assembly includes multiple spring-hinged mounting brackets to facilitate mounting the structure to the frame, with the spring-hinged mounting bracket being one spring-hinged mounting bracket of the multiple spring-hinged mounting brackets. In one embodiment, the cover structure includes opposite first and second sides, and a first spring-hinged mounting bracket of the multiple spring-hinged mounting brackets is mounted to and extends from the first side of the cover structure, and a second spring-hinged mounting bracket of the multiple spring-hinged mounting brackets is mounted to and extends from the second side of the cover structure.

In one or more embodiments, the first side of the cover structure includes a first slidable member, with a leaf of the first spring-hinged mounting bracket being the first slidable member (or being coupled thereto), and the second side of the cover structure includes a second slidable member, with a leaf of the second spring-hinged mounting bracket being the second slidable member (or being coupled thereto). In one implementation, the first and second slidable members are first and second spring-biased, telescoping, side-mounting surfaces that facilitate the first and second spring-hinged mounting brackets contacting respective vertical mounting rails of the frame of the electronics rack for mounting thereto.

Further, in one or more embodiments, the first and second spring-hinged mounting brackets are closer to one end of the cover structure than another end of the cover structure, and the structure includes first and second fixed-angle mounting brackets affixed to and extending from the cover structure closer to the other end of the structure, with the one end and the other end being opposite ends of the cover structure.

In one embodiment, the cover structure, the multiple spring-hinged mounting brackets, and the first and second slidable members are integrated as a single-piece assembly for mounting to any of multiple electronics racks, where the multiple electronics racks have vertical mounting rail flanges to which the multiple spring-hinged mounting brackets are to be mounted, and where the vertical mounting rail flanges are located at different depths within different electronics racks of the multiple electronics racks.

In one or more implementations, the cover structure mounts horizontally within the frame of the electronics rack, with the frame including multiple vertical mounting rails, and the obstruction being a vertical mounting rail of the multiple vertical mounting rails of the frame.

Further, in one embodiment, the apparatus can include an electronic component drawer coupled to the frame of the electronics rack, and the cover structure of the rack-mountable cover assembly is a cover structure fixedly mounts to the frame of the electronics rack.

By way of illustration, FIGS. 2A-5B depict one or more embodiments of an apparatus or rack-mountable assembly for mounting to the frame of an electronics rack, such as electronics rack 100 of FIG. 1. As noted above, numerous variations on the embodiment(s) depicted will be apparent to those skilled in the art based on the description provided herein.

Figure 2A:
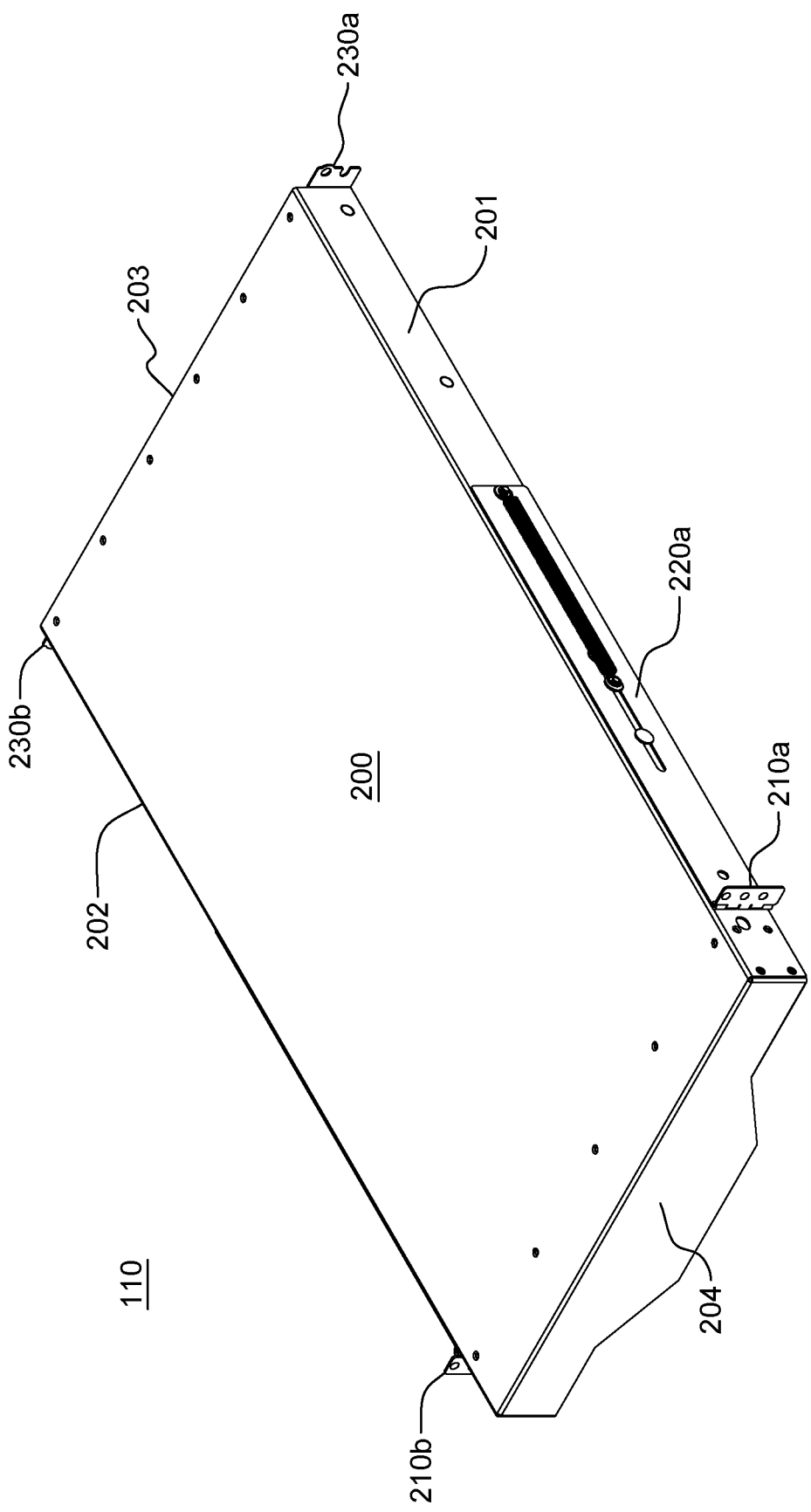
FIG. 2A depicts one embodiment of a cover to be fixedly mounted to a frame of an electronics rack, in accordance with one or more aspects of the present invention.
Figure 2B:
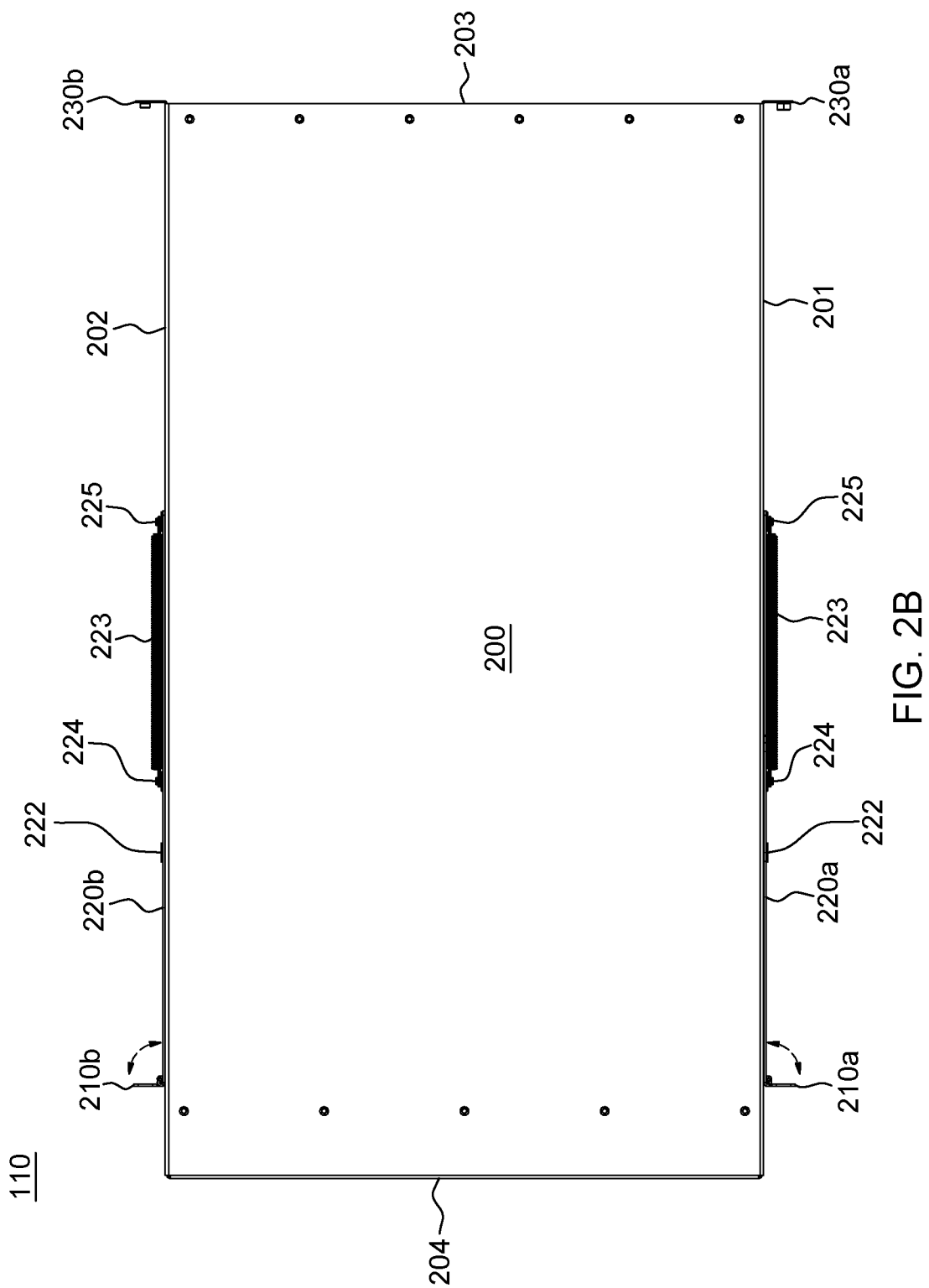
FIG. 2B is a top plan view of the cover embodiment of FIG. 2A, in accordance with one or more aspects of the present invention.
Figure 2C:
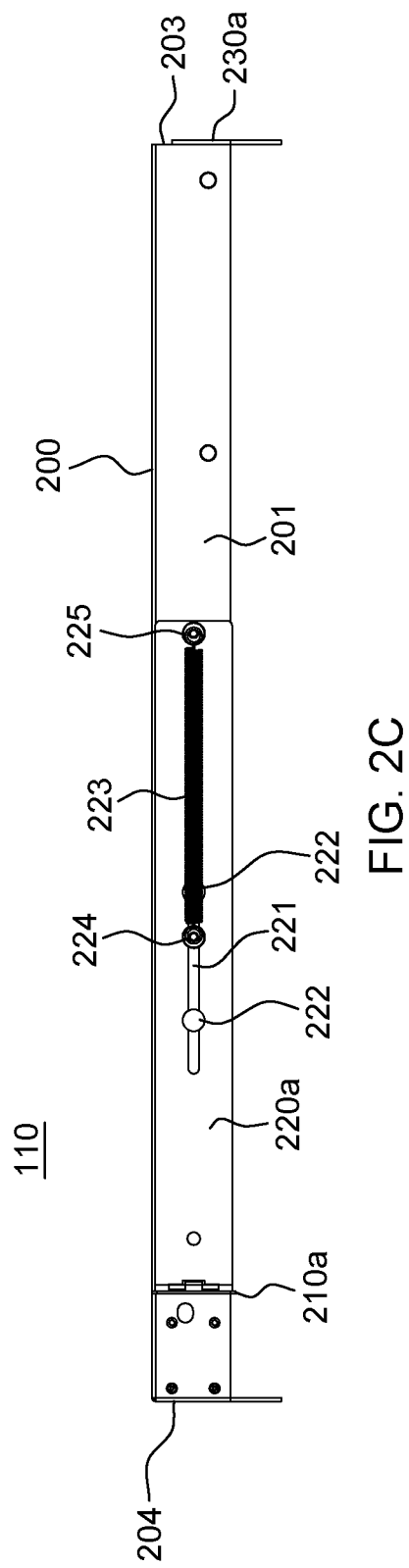
FIG. 2C is a side elevational view of the cover embodiment of FIGS. 2A & 2B, in accordance with one or more aspects of the present invention.

Referring initially to FIGS. 2A-2C, one embodiment of a cover 110 configured to be fixedly mounted to the frame of an electronics rack is illustrated. Cover 110 includes a structure 200, with opposite first and second sides 201, 202, and with one end 203 and another end 204, which are opposite ends of structure 200. In the embodiment illustrated, structure 200 is a rectangular-shaped lid structure configured to at least partially enclose one or more electronic components or devices within an electronic component chassis, such as drawer 102 of FIG. 1. As noted, cover 110 is, in one embodiment, a single-piece assembly, with the parts illustrated being permanently coupled together within the assembly. Note that the size, shape and configuration of first and second sides 201, 202, as well as of ends 203, 204, can vary depending, for instance, on the particular configuration of the drawer with which the cover is to mate when both are positioned within the electronics rack.

As illustrated in FIGS. 2A-2C, in one embodiment, cover 110 includes a first spring-hinged mounting bracket 210*a* associated with and extending from first side 201 of structure 200, and a second spring-hinged mounting bracket 210*b* associated with and extending from second side 202 of structure 200. In the embodiment illustrated, first side 201 of structure 200 includes a first slidable member 220*a*, and the first spring-hinged mounting bracket 210*a* is part of or otherwise associated with first slidable member 220*a*. Similarly, second side 202 of structure 200 includes a second slidable member 220*b*, and second spring-hinged mounting bracket 210*b* is part of or otherwise associated with second slidable member 210*b*.

In the embodiment illustrated, first and second slidable members 220a, 220b are first and second spring-biased, telescoping, side-mounting surfaces which include respective elongated slots 221 through which guide pins 222 extend and slidably couple the slidable member to the respective side of structure 200. Further, in the embodiment illustrated, the slidable members are spring-biased via a respective linear spring 223 that is positioned between a first support pin 224 affixed to the side of structure 200, and extending through slot 221, and a second support pin 225 coupled to the slidable member only. In this manner, spring-biasing is provided within a distance defined between guide pins 222. For instance, in one or more embodiments, guide pins 222 could be in the range of 2-6 inches apart, such that the spring-biased, telescoping, side-mounting surfaces can respectively telescope or retract, as required, for a particular frame configuration in order to align the corresponding first and second spring-hinged mounting brackets 210a, 210b, with (for instance) the respective rear vertical mounting rails of the rack. Note that this example assumes that the cover is moved into position within the frame for mounting to the frame from a front of the electronics rack. In the case where the cover is moved into position within the frame from the rear of the electronics rack, then the first and second spring-hinged mounting brackets 210a, 210b would mount to the front vertical mounting rails of the rack.

As noted, in one or more embodiments, cover 110 is a single-piece assembly. This can be accomplished, in part, by providing guide pins 222 and first and second support pins 224, 225 as swaged couplings, such as rivet-type couplings, permanently, slidably affixing slidable members 220a, 220b, to the respective sides of structure 200. Note in particular that guide pins 220 and first support pin 224, are of sufficient size to allow the slidable members 220a, 220b, to slide relative to the respective side of cover structure 200 within the respective elongated slot 221.

Figure 3A:
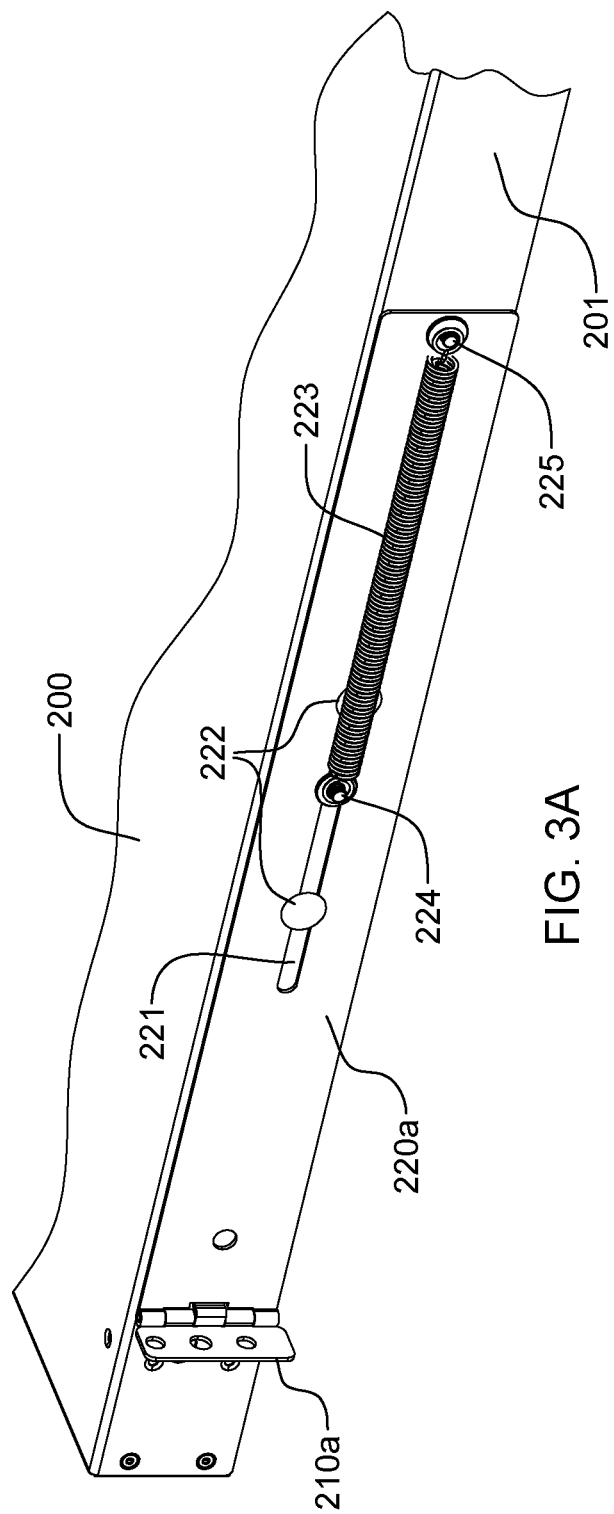
FIG. 3A depicts an enlarged view of a slidable member and spring-hinged mounting bracket of the cover embodiment of FIGS. 2A-2C, in accordance with one or more aspects of the present invention.
Figure 3B:
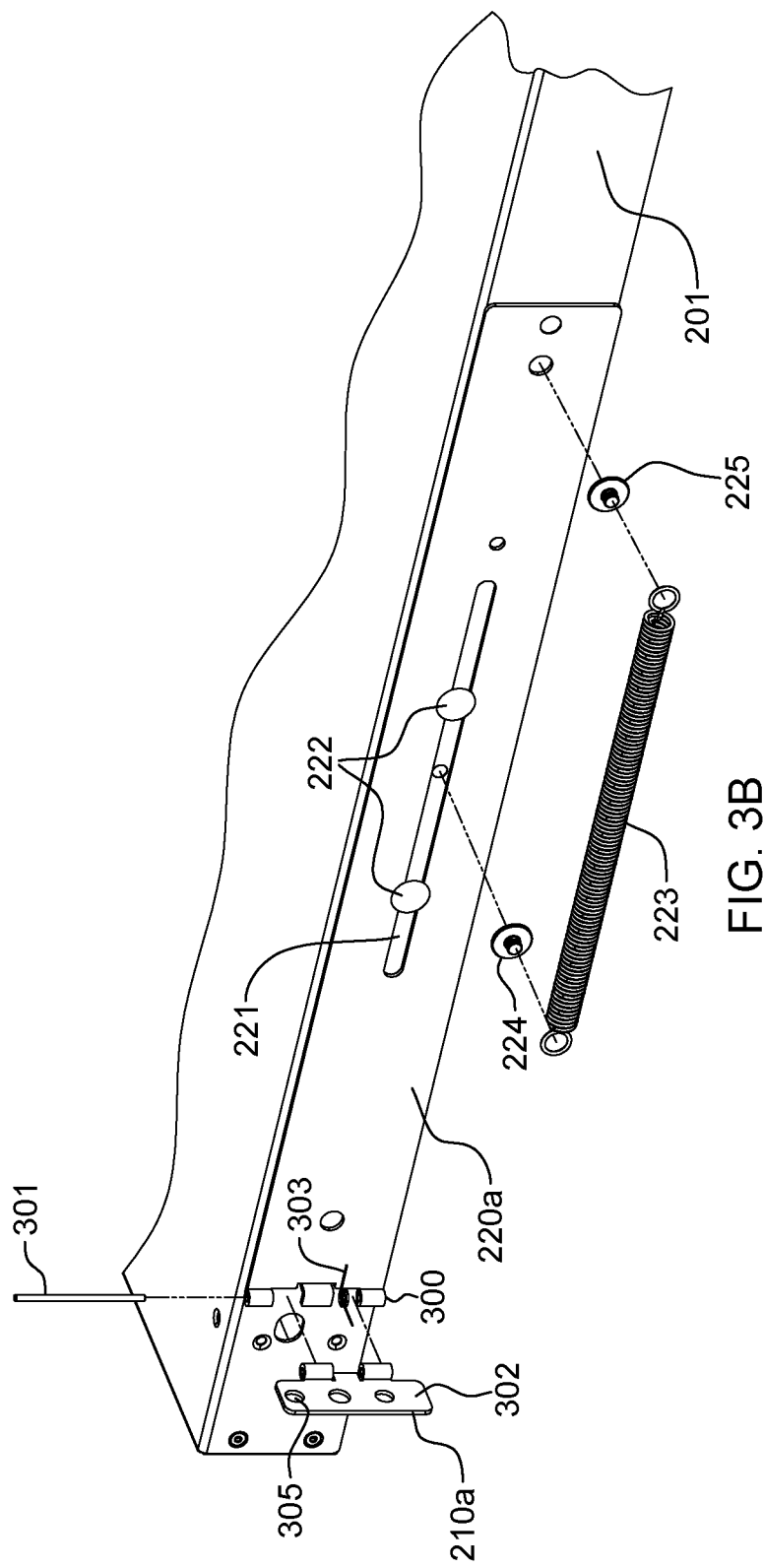
FIG. 3B is an exploded view of the slidable member and spring-hinged mounting bracket of FIG. 3A, in accordance with one or more aspects of the present invention.

FIGS. 3A & 3B depict in greater detail one embodiment of slidable member 220a and spring-hinged mounting bracket 210a associated therewith. In one or more implementations, slidable member 220b and spring-hinged mounting bracket 210b associated therewith are identical to slidable member 220a and spring-hinged mounting bracket 210a. As noted, the spring-hinged mounting brackets are provided for ease of installation of the rack-mountable assembly within a frame of an electronics rack. The spring-biasing of the spring-biased mounting brackets allow the cover to be slid into final position within the frame, even when the frame is fully populated, as designed. Further, the spring-hinged mounting brackets allow the cover to be slid into position within the frame of the electronics rack from either the front or back of the rack, such as might be desirable during servicing or maintenance of the electronics rack.

As illustrated in FIG. 3B, slidable member 220a is (in one embodiment) a leaf of spring-hinged mounting bracket 210a and is formed with a non-pivoting portion 300 of spring-hinged mounting bracket 210a as a part of slidable member 220a at one end thereof. The other leaf 302 of spring-hinged mounting bracket 210a aligns with non-pivoting portion 300, and a hinge pin 301 couples the leaves of spring-hinged mounting bracket 210a together. Further, a hinge spring 303 is provided within spring-hinged mounting bracket 210a to spring-bias the mounting bracket open outward from slidable member 220a at an angle. For instance, in one embodiment, leaf 302 of spring-hinged mounting bracket 210a is biased at a right angle to slidable member 220a. The ends of hinge pin 301 can be swaged in implementation in order to secure the spring-hinged mounting bracket 210a to the slidable member 220a as a single-piece assembly. In the embodiment illustrated, openings 305 are provided in leaf 302, which are sized and positioned to align with corresponding openings in a vertical mounting rail flange within the electronics rack to which the rack-mountable assembly is to be fixedly secured using, for instance, appropriately sized and configured fasteners.

As noted, slidable member 220a is (in one embodiment) a spring-biased, telescoping, side-mounting surface, which includes elongated slot 221 accommodating guide pins 222, as well as first support pin 224 affixed to the side of the structure. Spring 223 biases, in one embodiment, the spring-biased, telescoping side surface in an extended position to facilitate contacting of spring-hinged mounting bracket 210a with the respective vertical mounting rail within the rack as the cover is moved into position within the frame for mounting to the frame. Spring 223 couples to first and second support pins 224, 225 at its ends with, for instance, the support pins being deformed or swaged once the spring is in position, to securely capture the ends of the spring, thus facilitating defining the single-piece assembly. Note that as used herein, the phrase single-piece assembly refers to there being no parts to assemble in association with positioning the assembly within the electronics rack, that is, other than the fasteners (not shown) used to rigidly mount the assembly to the frame of the electronics rack, as described herein.

Figure 4A:
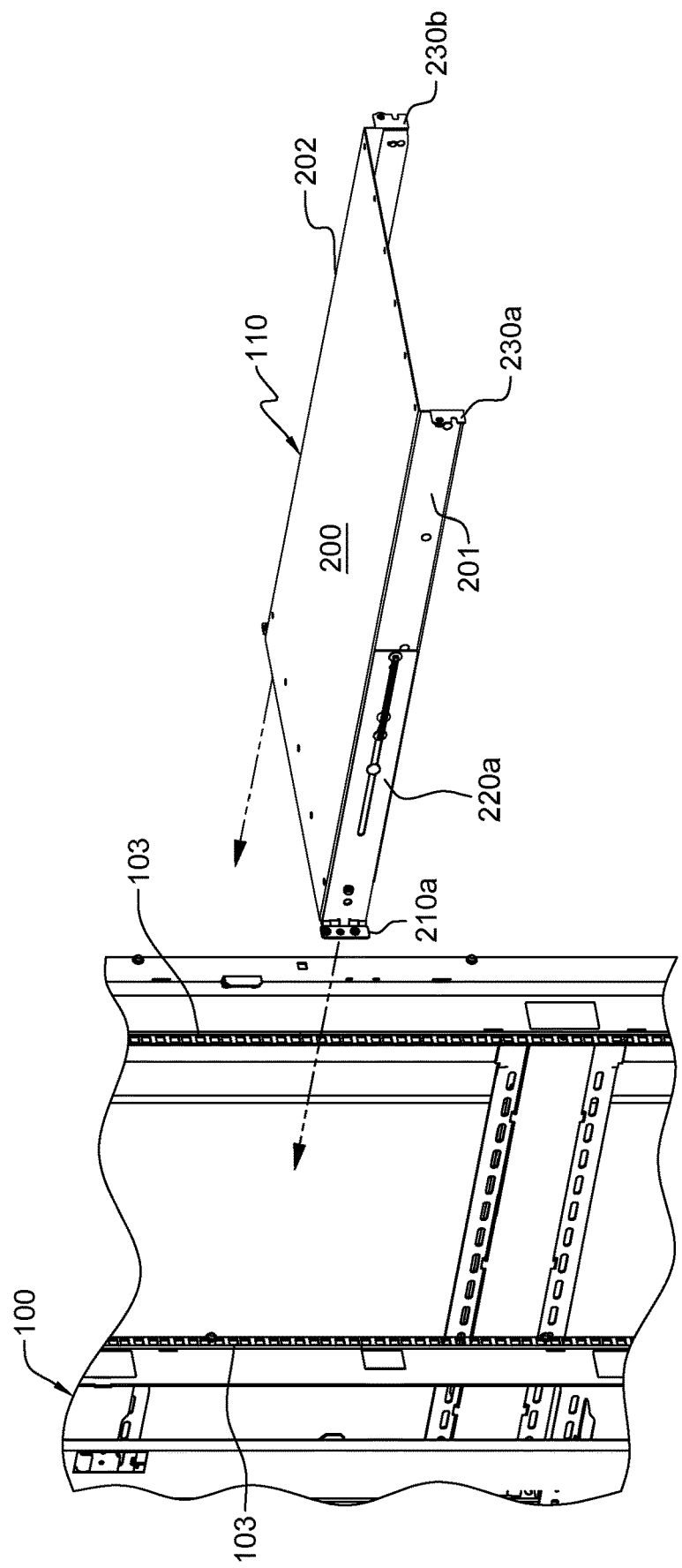
FIGS. 4A-4D depict insertion of a cover, such as the cover of FIGS. 2A-3B, into an electronics rack for mounting to the frame of the electronics rack, including showing pivoting of the spring-hinged mounting bracket(s) inward towards the side(s) of the structure upon encountering an obstruction, in accordance with one or more aspects of the present invention.
Figure 4B:
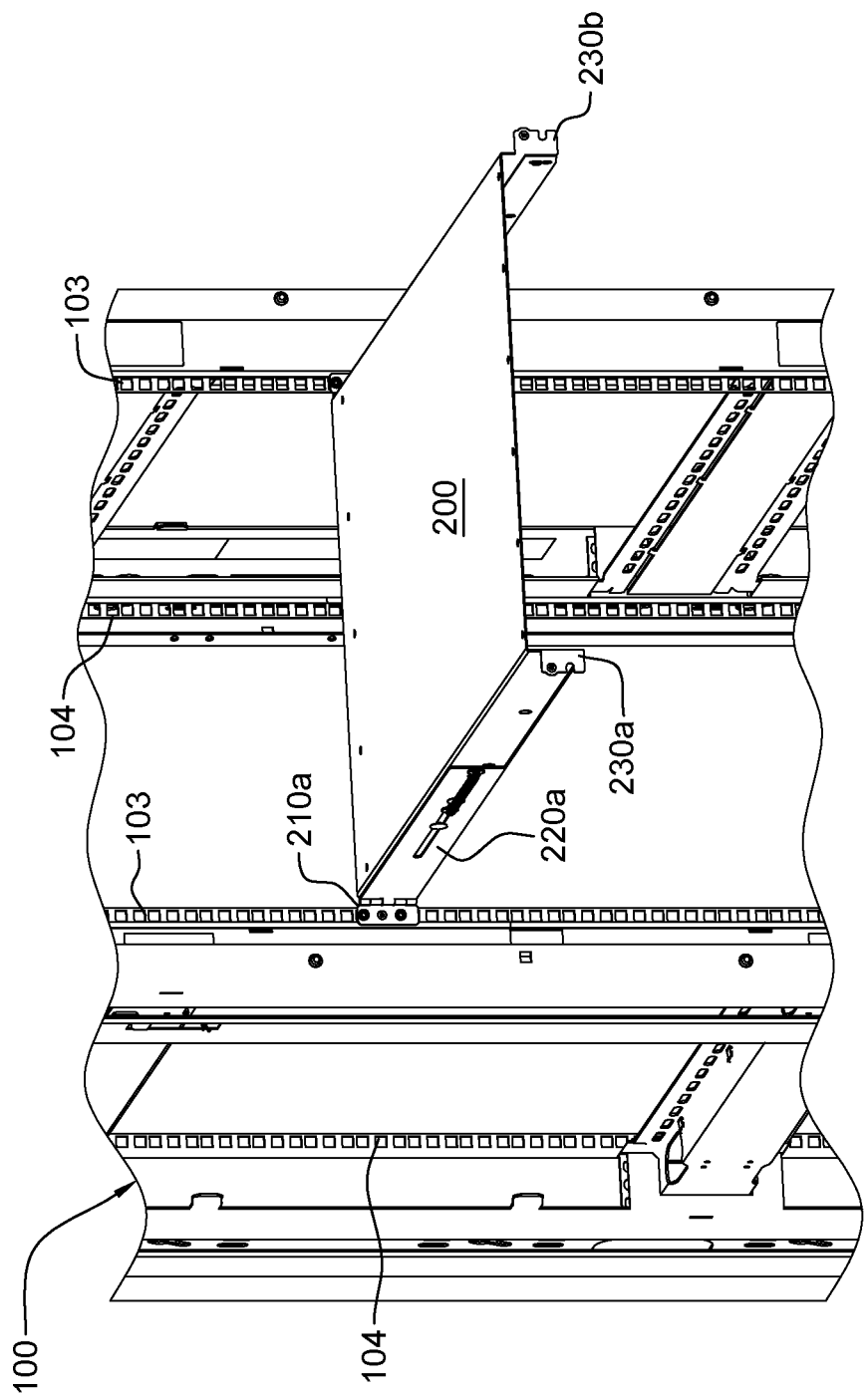
Figure 4C:
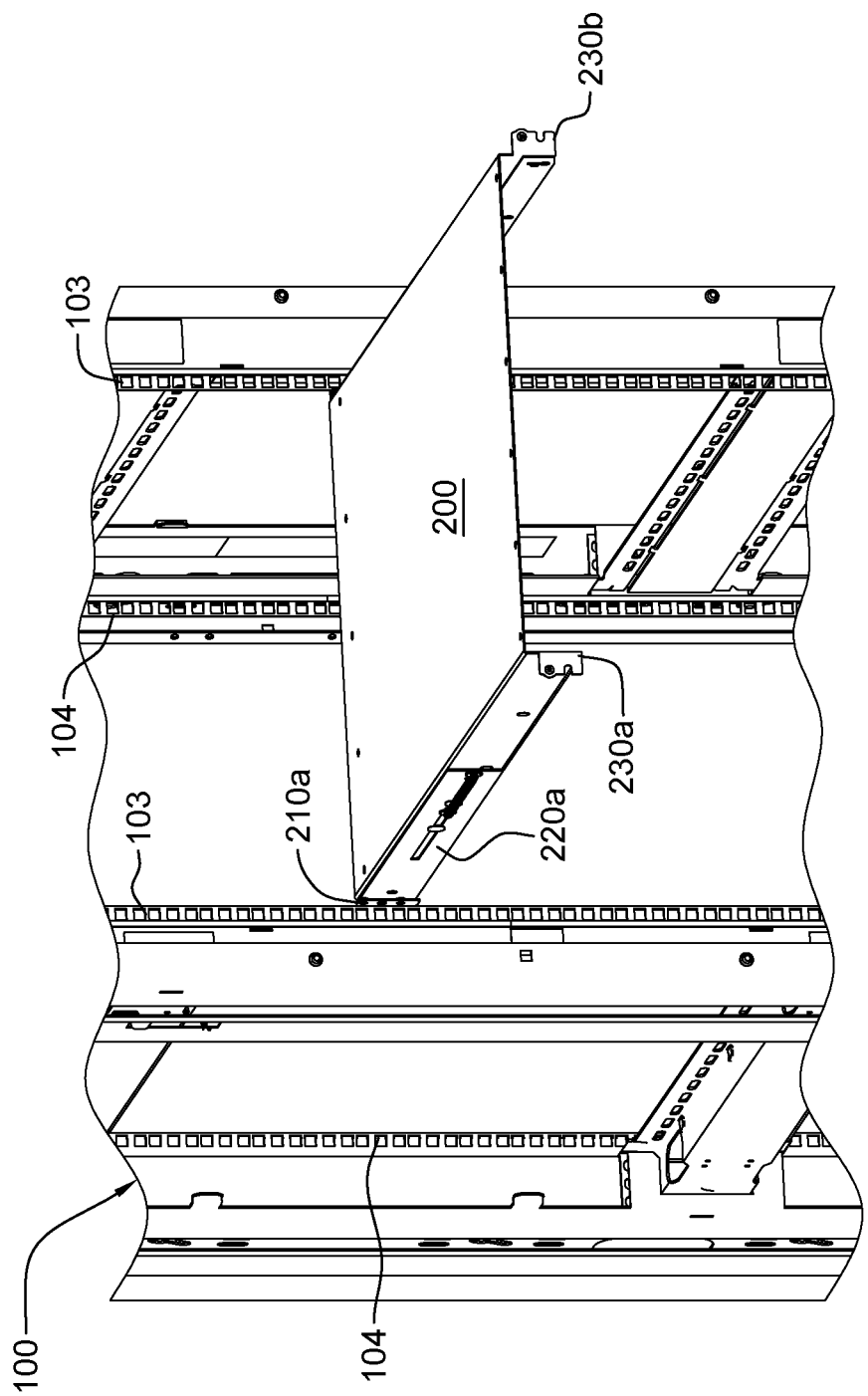
Figure 4D:
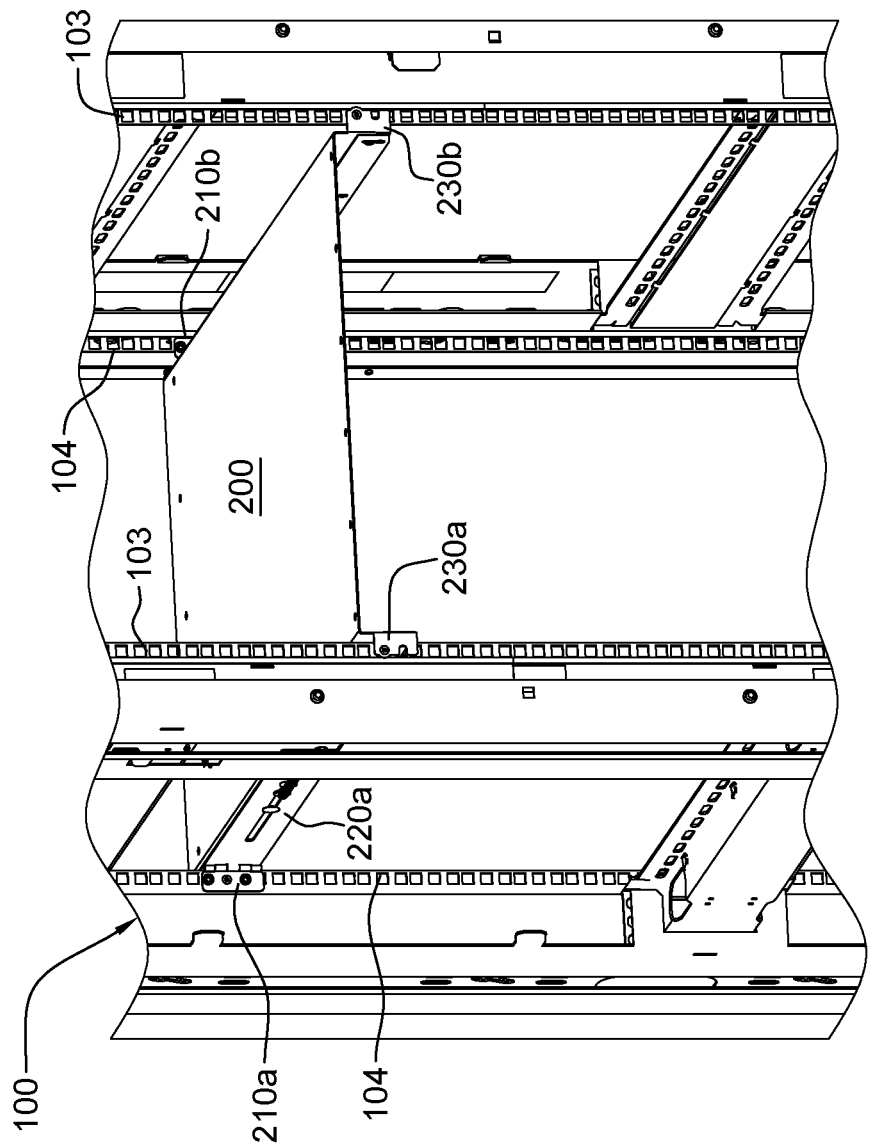

By way of further example, FIGS. 4A-4D depict operation of the spring-hinged mounting brackets as the cover is slid into position within an unpopulated frame of an electronics rack 100. In the embodiment illustrated, first and second spring-hinged mounting brackets 210a, 210b are disposed at respective sides 201, 202 at one end of structure 200, with the other end including fixed-angle mounting brackets 230a, 230b which, in one or more embodiments, are rigid mounting brackets. Note that in this illustration, the end wall structures of FIGS. 2A-2C are not shown. In FIG. 4A, structure 200 is shown being moved into the frame of electronics rack 100 in a final, mounting orientation, that is, in an orientation corresponding to the orientation with which the structure is mounted into the frame. In this case, structure 200 is oriented substantially horizontal as it is moved into the frame of the electronics rack. In FIG. 4B, spring-hinged mounting brackets 210a, 210b, encounter front vertical mounting rails 103 of the frame at, for instance, the front of the frame. As the structure continues to be moved into the frame, the spring-hinged mounting brackets pivot inward towards the side of the structure as the spring-hinged mounting brackets are pushed against the respective vertical mounting rails, as shown in FIG. 4C. In FIG. 4D, the spring-hinged mounting brackets 210a, 210b have moved past the respective front vertical mounting rails 103 at the front edge of the frame, and pivoted open to an extended position to facilitate fixedly mounting the structure to the frame using appropriate fasteners. In particular, in one or more embodiments, the fixed-angle mounting brackets 230a, 230b are fastened to the front vertical rail flanges using appropriate fasteners, and the spring-hinged mounting brackets 210a, 210b are secured to the respective rear vertical mounting rails 104, thereby fixedly mounting the cover to the frame.

FIGS. 5A & 5B are side elevational views showing operation of the slidable members at the first and second side surfaces of the structure, and in particular operation of the spring-biased, telescoping, side-mounting surfaces. By way of example, in FIG. 5A, spring-hinged mounting bracket 210a of cover 110 has encountered the rear vertical mounting rail 104, pivoting inward, and in FIG. 5B, the spring-biased, telescoping side surface has moved the spring-hinged mounting bracket past the rear vertical mounting rail 104 to, for instance, facilitate mounting the spring-hinged mounting bracket from the back of the electronics rack to the rear vertical mounting rail flange. Advantageously, in one or more embodiments, slidable member 220a is spring-biased in an extended position (to the left in FIGS. 5A & 5B) to assist in mounting the structure to a range of different rack depths. In one implementation, the slidable member can be spring-biased to default to any desired default length, with the position of the spring-hinged mounting brackets being readily manipulated by an operator or service technician in order to align the brackets in the appropriate position against the respective vertical support rail flange to which the structure is to be affixed, either from the front side or the back side of the electronics rack.

As noted, traditionally a computer server drawer features a top cover that is latched to the drawer chassis, with the combination being slid out of the server rack on slides before the top cover can be unlatched and removed from the server drawer. The latching of the top cover directly to the drawer facilitates, in part, directing a cooling airflow through the enclosure, for instance, from an air-inlet side of the drawer to an air-outlet side of the drawer, and also facilitates shielding electromagnetic interference (EMI) via the direct latching, and resultant uniform contact, between the cover and the drawer.

A rack-mountable assembly which includes a cover fixedly mounted to the frame of an electronics rack, such as described above in connection with FIGS. 2A-5B, and a drawer configured to slidably mount to the frame of the electronics rack adjacent to the cover to slide relative to the cover, may be unable to achieve a desired seal between the drawer and the fixedly mounted cover due to, for instance, mechanical slide tolerances of the drawer and variabilities inherent to such a configuration.

Disclosed herein therefore are rack-mountable assemblies which include one or more electromagnetic shielding structures to provide, at least in part, electromagnetic shielding at a gap between the cover and the drawer when the cover and drawer are operatively positioned within the electronics rack. The electromagnetic shielding structure(s) advantageously provides electromagnetic shielding, as well as, in one or more embodiments, sealing airflow at the gap between the cover and drawer in a rack-mountable assembly configuration where the drawer slides axially relative to a fixedly mounted cover within the frame of the electronics rack.

Generally stated, disclosed herein in another aspect, is a rack-mountable assembly which includes a cover configured to fixedly mount to a frame of an electronics rack, and a drawer configured to slidably mount to the frame of the electronics rack adjacent to the cover to slide relative to the cover. When operatively positioned within the electronics rack, the cover and drawer together define an enclosure to enclose one or more electronic components. The rack-mountable assembly also includes an electromagnetic shielding structure to provide, at least in part, electromagnetic shielding at a gap between the cover and the drawer when the cover and drawer are operatively positioned within the electronics rack. The electromagnetic shielding structure includes an electromagnetic shielding plate. The electromagnetic shielding plate overlies, at least in part, the gap between the cover and the drawer, and self-adjusts with sliding of the drawer into the electronics rack to facilitate providing the electromagnetic shielding at the gap between the cover and drawer.

In one or more implementations, the electromagnetic shielding structure of the rack-mountable assembly is slidably coupled to the cover to depend from the cover, and is sized and configured so that an edge of the drawer contacts the electromagnetic shielding structure as the drawer is slid into operative position within the electronics rack. In one or more implementations, the electromagnetic shielding plate includes multiple slots, and the cover includes multiple guide pins which extend through the multiple slots to slidably couple the electromagnetic shielding plate to the cover.

In one or more implementations, a guide pin of the multiple guide pins is spring-biased out from the cover to loosely couple the electromagnetic shielding plate to the cover, and thereby facilitate the electromagnetic shielding plate extending downward from the cover due to gravity when the cover is fixedly mounted to the frame of the electronics rack. Further, in one or more embodiments, the enclosure defined by the cover and the drawer when operatively positioned within the electronics rack is substantially sealed at the gap between the cover and drawer by the electromagnetic shielding structure, where the electromagnetic shielding plate is a rigid structure assisting with electromagnetic compatibility (EMC), as well as operating an air-gasket to block airflow at the gap between the cover and the drawer along at least a side of the drawer, when operatively positioned within the electronics rack.

In one or more embodiments, the electromagnetic shielding structure includes a contact element disposed along an edge of the electromagnetic shielding plate to contact the edge of the drawer with sliding of the drawer into operative position within the electronics rack. The contact element is formed of an electrically conductive material to facilitate providing the electromagnetic shielding at the gap between the cover and the drawer. For instance, in one embodiment, the contact element is a wave-patterned element disposed along the edge of the electromagnetic shielding plate. The wave-patterned element is configured to facilitate contacting the edge of the drawer when the drawer is slid into operative position within the electronics rack.

In one or more embodiments, the rack-mountable assembly further includes multiple electromagnetic shielding structures, with the electromagnetic shielding structure being one electromagnetic shielding structure of the multiple electromagnetic shielding structures. In one embodiment, the cover includes a first side and a second side, and a first electromagnetic shielding structure of the multiple electromagnetic shielding structures is slidably coupled to the first side of the cover, and a second electromagnetic shielding structure of the multiple electromagnetic shielding structures is slidably coupled to the second side of the cover.

In one or more embodiments, the first electromagnetic shielding structure includes a first electromagnetic shielding plate with multiple slots, and the second electromagnetic shielding structure includes a second electromagnetic shielding plate with multiple slots. Further, the cover includes, or has associated therewith, multiple guide pins which extend through the multiple slots of the first and second electromagnetic shielding plates to slidably couple the first and second electromagnetic shielding plates to the cover.

In one or more embodiments, the rack-mountable assembly further includes spring-biasing coupled to the electromagnetic shielding structure to facilitate extending the electromagnetic shielding structure downward from the cover so that the electromagnetic shielding structure is contacted by the edge of the drawer and self-adjusts with sliding of the drawer into operative position within the electronics rack adjacent to the cover.

In one or more further embodiments, the electromagnetic shielding structure of the rack-mountable assembly is slidably coupled to the drawer to extend from the drawer, and an edge of the cover is in contact with the electromagnetic shielding structure as the drawer is slid into operative position within the electronics rack adjacent to the cover. Further, spring-biasing is coupled to the electromagnetic shielding structure to facilitate extending the electromagnetic shielding structure from the drawer to contact the edge of the cover as the drawer slides into operative position within the electronics rack.

In one or more embodiments, the electromagnetic shielding plate self-adjusts in a direction substantially transverse to a sliding direction of the drawer into the frame to facilitate providing the electromagnetic shielding at the gap between the cover and the drawer when operatively positioned within the electronics rack.

Those skilled in the art will note that provided herein is a self-adjusting electromagnetic interference shielding and airflow sealing structure for sliding contact surfaces. In one or more embodiments, the structure includes guide pins and one or more mounting holes or slots for coupling to, for instance, an upper, fixed chassis lid, where the structure is located along a length of a side of the cover and the associated sliding drawer. The sliding drawer is slidable out from the upper, fixed chassis, and the structure coupled to the upper, fixed chassis contacts an upper portion of the sliding drawer with sliding of the drawer into operative position below the lid within, for instance, an electronics rack. The structure includes, in one implementation, a wave-pattern element on a lower surface of an electromagnetic shielding plate of the structure to facilitate contacting an upper portion of the sliding drawer. Together, the plate and the wave-pattern element facilitate providing electromagnetic compatibility and airflow sealing of the assembly at the gap between the upper, fixed chassis lid and the sliding drawer.

By way of illustration, FIGS. 6A-7B depict one embodiment of a rack-mountable assembly 600, in accordance with one or more aspects of the present invention.

Figure 6A:
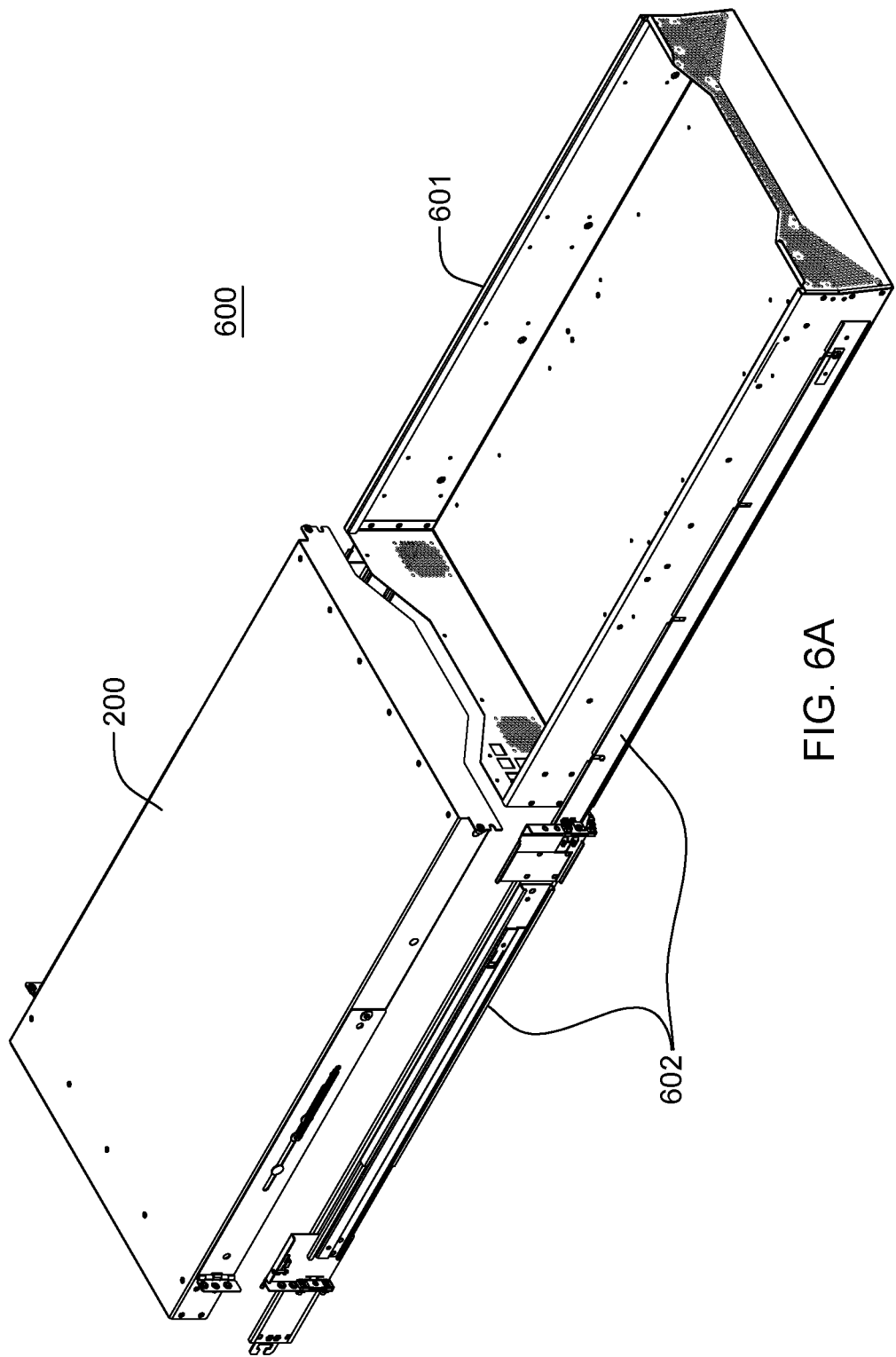
FIG. 6A depicts one embodiment of a rack-mountable assembly, including a cover, such as the cover of FIGS. 2A-3B, to fixedly mount to a frame of an electronics rack, and a drawer to slidably mount to the frame of the electronics rack adjacent to the cover, in accordance with one or more aspects of the present invention.
Figure 6B:
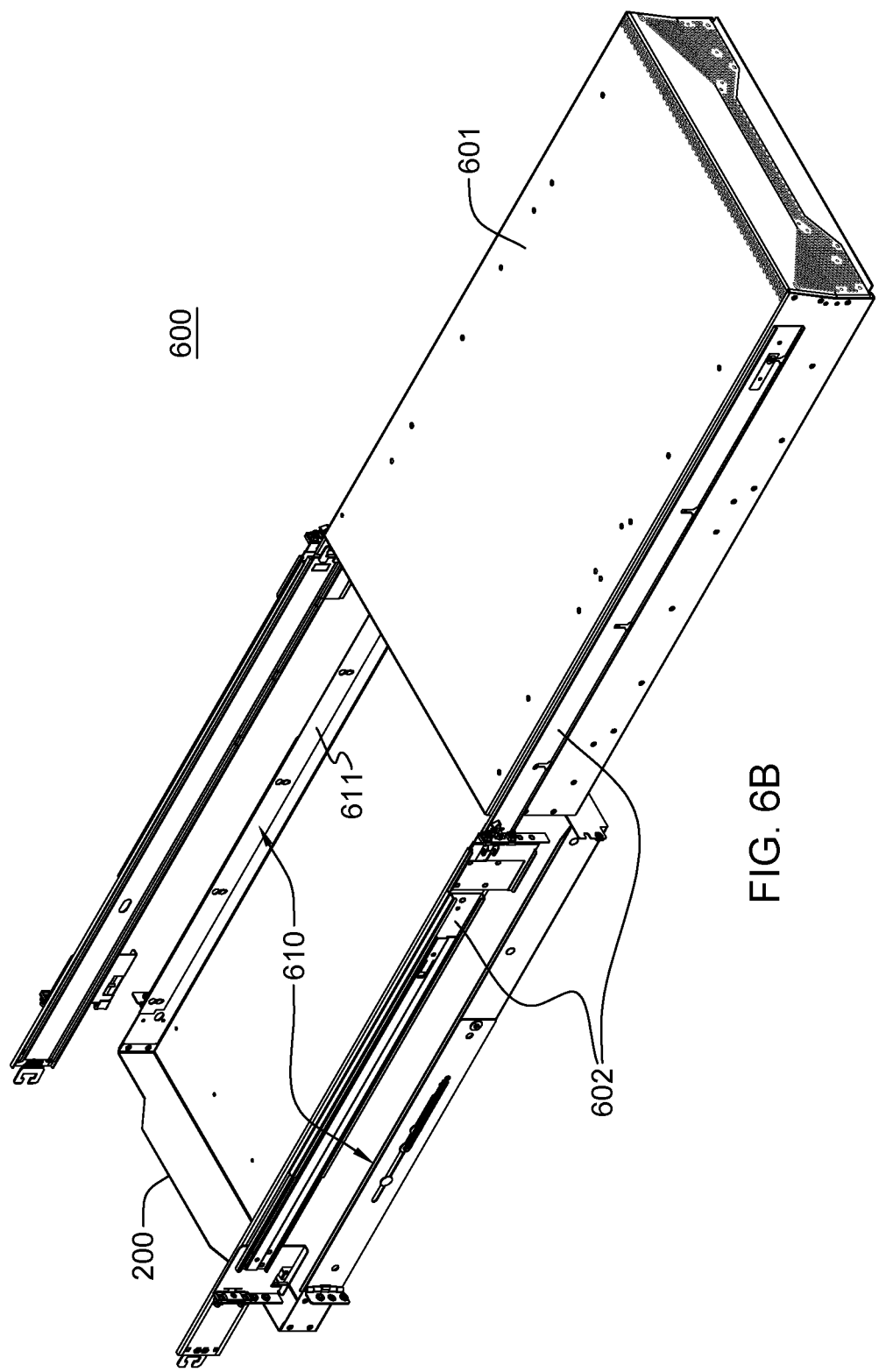
FIG. 6B is a bottom view of the rack-mountable assembly embodiment of FIG. 6A, in accordance with one or more aspects of the present invention.

Referring collectively to FIGS. 6A-6C, rack-mountable assembly 600 includes a cover configured to fixedly mount to a frame of an electronics rack, such as cover structure 200 described above in connection with FIGS. 2A-5B, and a drawer 601 configured to slidably mount to the frame of the electronics rack adjacent to the cover to slide relative to the cover. Drawer slides or runners 602 are provided to facilitate slidable mounting of drawer 601 to the frame of the electronics rack, such as to the frame of electronics rack 100 depicted in FIG. 1. Note that cover 200 and drawer 601 can have any of a variety of configurations. In one or more embodiments, cover 200 and drawer 601 are configured so that when operatively positioned within the electronics rack, the cover and drawer together define an enclosure to enclose one or more electronics components (not shown) disposed within drawer 601. For instance, a first end and a second end of cover 200 can be configured to mate with or overlap the respective ends of drawer 601 to facilitate forming the enclosure when the cover and drawer are operatively positioned within the electronics rack.

As noted, a rack-mountable assembly, such as rack-mountable assembly 600 of FIGS. 6A-6C, may be unable to achieve a sufficient seal between the rack-mounted cover structure 200 and the slidable drawer 601 along the sides of the drawer and cover due to mechanical tolerances and variabilities inherent in such a configuration where the drawer slides relative to the cover.

In one or more embodiments, provided herein are one or more electromagnetic shielding structures that provide electromagnetic interference (EMI) shielding at, and also facilitate sealing against airflow through, a gap between the slidable drawer and the fixedly mounted cover, such as along the sides of the cover and drawer. The electromagnetic shielding structure(s) can be used in any rack-mounted assembly where, for instance, a drawer or electronic component chassis, is mounted to slide axially relative to, for instance, a respective cover or lid fixedly mounted to the frame of the electronics rack.

As illustrated in FIGS. 6B & 6C, in one or more embodiments, an electromagnetic shielding structure 610 includes a drawer-length plate 611 or strip of conductive material, such as a metal, a conductive plastic, or a combination thereof, which is coupled to a respective side of cover structure 200 via multiple guide pins to slot couplings. In one embodiment, each electromagnetic shielding structure 610 extends for a length of the sidewall of drawer 601. As illustrated in FIG. 6C, a nominal interference is designed into the fitment between the cover structure fixedly mounted to the frame of the rack, and the sliding drawer 601, allowing the electromagnetic shielding structure(s), including an electromagnetic shielding plate(s) 611, to cam along a respective upper edge of the drawer 601 sidewall as the drawer slides into the frame, forming a substantially uniform contact between the electromagnetic shielding structure and drawer with minimal sensitivity to assembly tolerances. In one or more embodiments, the electromagnetic shielding plate 611 is chamfered 615 or angled at a leading edge to initially contact the upper edge of the drawer 601 sidewall as the drawer is slid into the frame, as illustrated, for instance, in FIG. 6C.

Figure 7A:
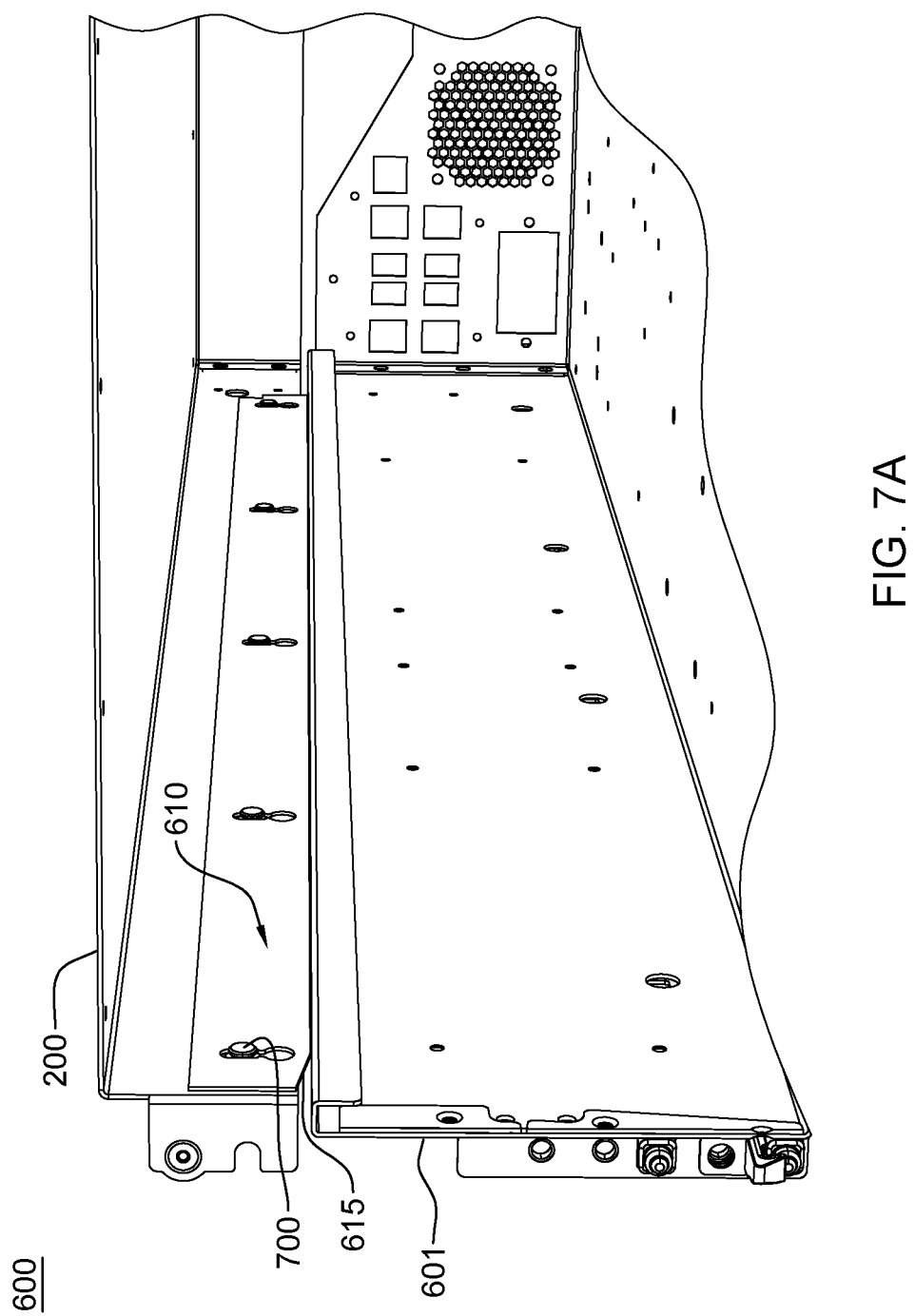
FIG. 7A is an enlarged, partial depiction of the rack-mountable assembly embodiment of FIGS. 6A-6C, in accordance with one or more aspects of the present invention.
Figure 7B:
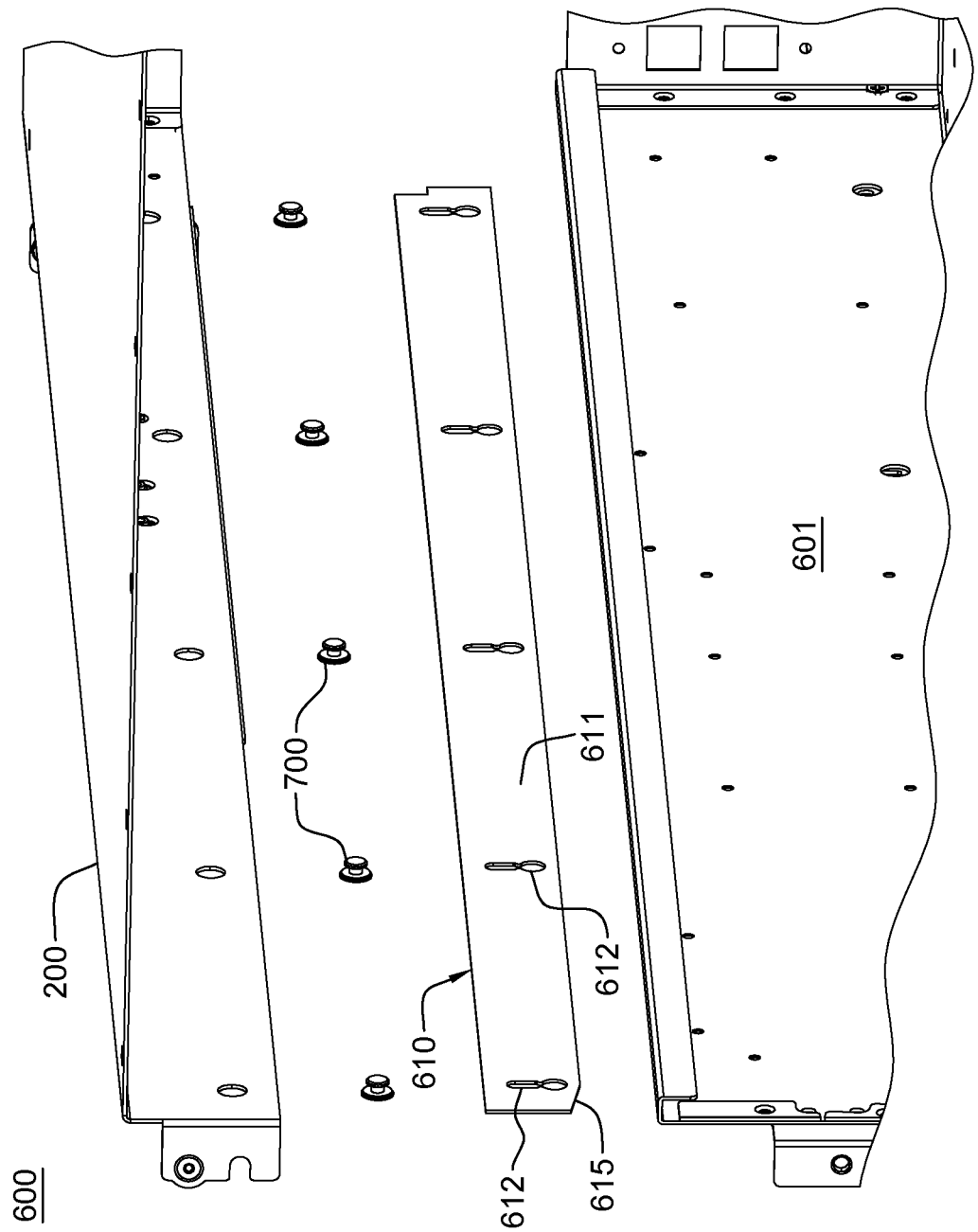
FIG. 7B is a partially exploded view of the rack-mountable assembly of FIG. 7A, in accordance with one or more aspects of the present invention.

FIGS. 7A & 7B depict rack-mountable assembly 600 of FIGS. 6A-6C, and show in greater detail one embodiment of electromagnetic shielding structure 610, in accordance with one or more aspects of the present invention. As illustrated, electromagnetic shielding structure 610 includes an electromagnetic shielding plate 611, formed of a conductive material, which includes multiple vertically-oriented slots 612, each of which is configured to receive a respective guide pin 700 coupled, in the depicted embodiment, to cover 200 along a sidewall thereof. As illustrated, guide pins 700 are sized and configured to slidably couple the electromagnetic shielding plate 611 to the cover 200, and allow electromagnetic shielding plate 611 of electromagnetic shielding structure 610 to extend downward from the cover due to gravity, with guide pins 700 residing, for instance, in the upper-most portion of slots 612 when the drawer is removed from the rack. With sliding of drawer 601 into operative position within the electronics rack, the upper edge of the respective sidewall of drawer 601 makes contact with the electromagnetic shielding structure 610 to allow the electromagnetic shielding structure to self-adjust in a direction substantially transverse to the sliding direction of the drawer into the frame. This self-adjusting facilitates maintaining the electromagnetic shielding structure in contact with the sidewall of drawer 601, thereby providing the electromagnetic shielding at the gap between the cover and drawer, as well as assisting in forming an air-seal at the gap to prevent, for instance, airflow through the drawer from escaping through or along the gap between the cover and drawer when operatively positioned within the electronics rack.

FIGS. 8A & 8B partially depict a further embodiment of a rack-mountable assembly, in accordance with one or more aspects of the present invention. The rack-mountable assembly is similar to rack-mountable assembly 600 described above in connection with FIGS. 6A-7B, including cover 200 and drawer 601, and an electromagnetic shielding structure 610' provides, at least in part, electromagnetic shielding at a gap between the cover and the drawer when the cover and drawer are operatively positioned within an electronics rack. In this embodiment, electromagnetic shielding structure 610' is substantially similar to electromagnetic shielding structure 610 described above. An exception is the inclusion of a contact element 800 disposed along a lower edge 613 of electromagnetic shielding plate 611 to contact the upper edge 603 of the sidewall of drawer 601 with sliding of drawer 601 into operative position within the electronics rack. In one or more embodiments, contact element 800 is formed of a conductive material to facilitate providing the electromagnetic shielding at the gap between the cover and the drawer. Further, contact element 800 can be any of a variety of configurations, with the wave-pattern configuration depicted in FIGS. 8A & 8B being one example only. For instance, contact element 800 can be configured as any type of spring structure to facilitating maintaining substantially uniform contact between electromagnetic shielding structure 610' and the sidewall of drawer 601 as the drawer is slid into the electronics rack, and with the drawer operatively positioned within the electronics rack. In one or more embodiments, the thickness and configuration of contact element 800 are minimized so that the electromagnetic shielding structure 610' substantially provides both electromagnetic interference shielding and airflow sealing at the gap between the fixedly mounted cover and the slidable drawer positioned beneath the fixedly mounted cover within the electronics rack. In the implementation depicted, the electromagnetic shielding structure 610' provides continuous sealing along the sidewall of the drawer at the gap between the cover and drawer, with the continuous sealing being provided by gravitational force, along with appropriately configured guide pins and slots, to provide a substantially uniform seal, despite any possible mechanical misalignment, either angular or linear, in both axis, between cover 200 and drawer 601.

As also shown in the embodiment of FIGS. 8A & 8B, a rack-mountable assembly in accordance with one or more aspects of the present invention can include spring-biasing 810 at one or more guide pins of the multiple guide pins to, for instance, provide non-restricted, slidable coupling of the electromagnetic shielding plate to the cover, and thereby facilitate the electromagnetic shielding plate extending downward from the cover due to gravity when the cover is fixedly mounted to the frame of the electronics rack. In one implementation, each guide pin of the multiple guide pins coupling the electromagnetic shielding plate to the cover can have a spring 810 associated therewith, if desired.

Figure 9:
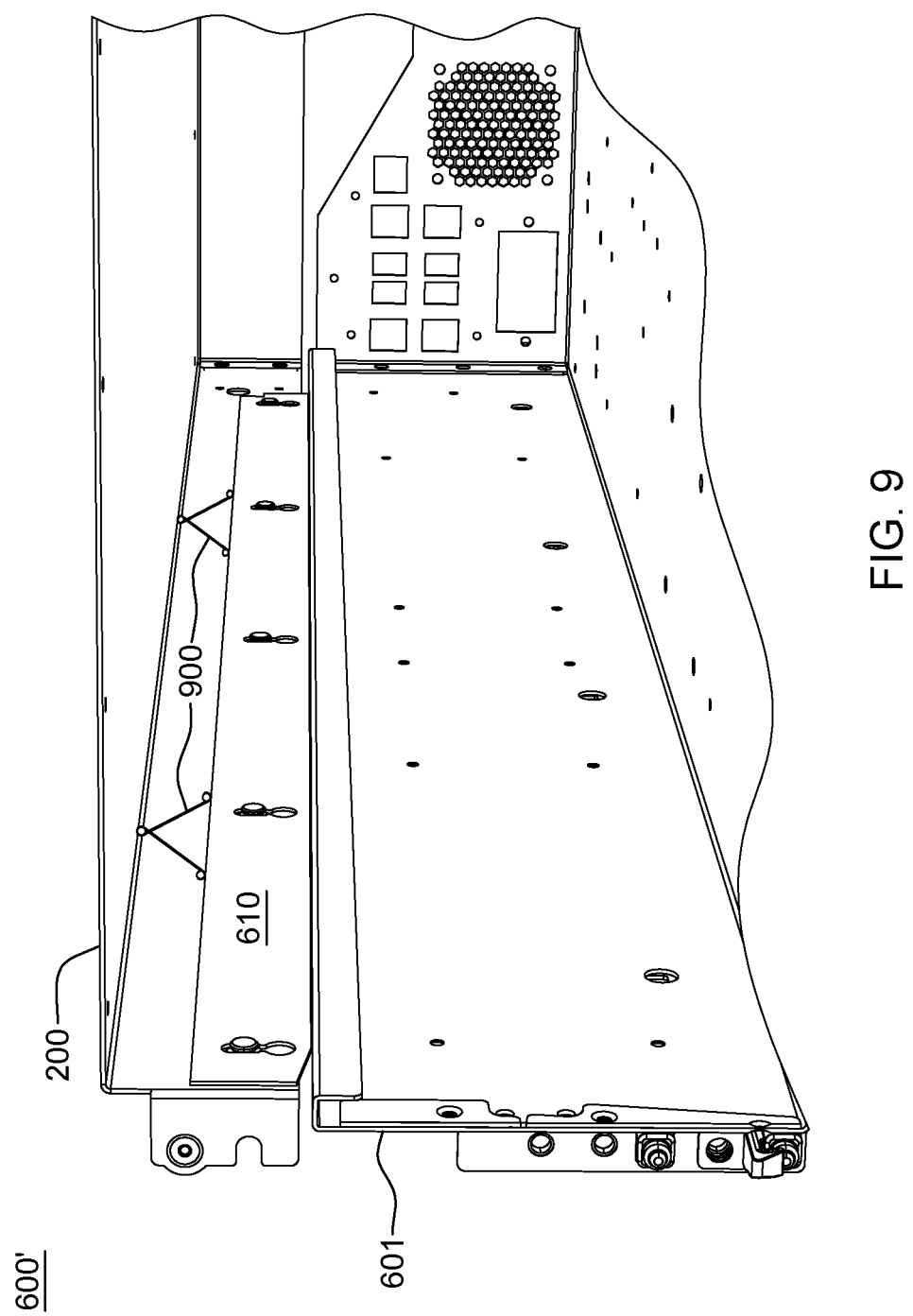
FIG. 9 depicts another embodiment of a rack-mountable assembly, in accordance with one or more aspects of the present invention.

FIG. 9 depicts a rack-mountable assembly 600', similar to rack-mountable assembly 600 of FIGS. 6A-7B, with spring-biasing 900 also included between cover 200 and electromagnetic shielding structure 610, to spring-bias electromagnetic shielding structure 610 downward from cover 200, and thereby provide additional downward force to ensure uniform contact between electromagnetic shielding structure 610 and the upper sidewall edge of the drawer 601 when the drawer is operatively positioned within the electronics rack below cover 200.

Figure 10:
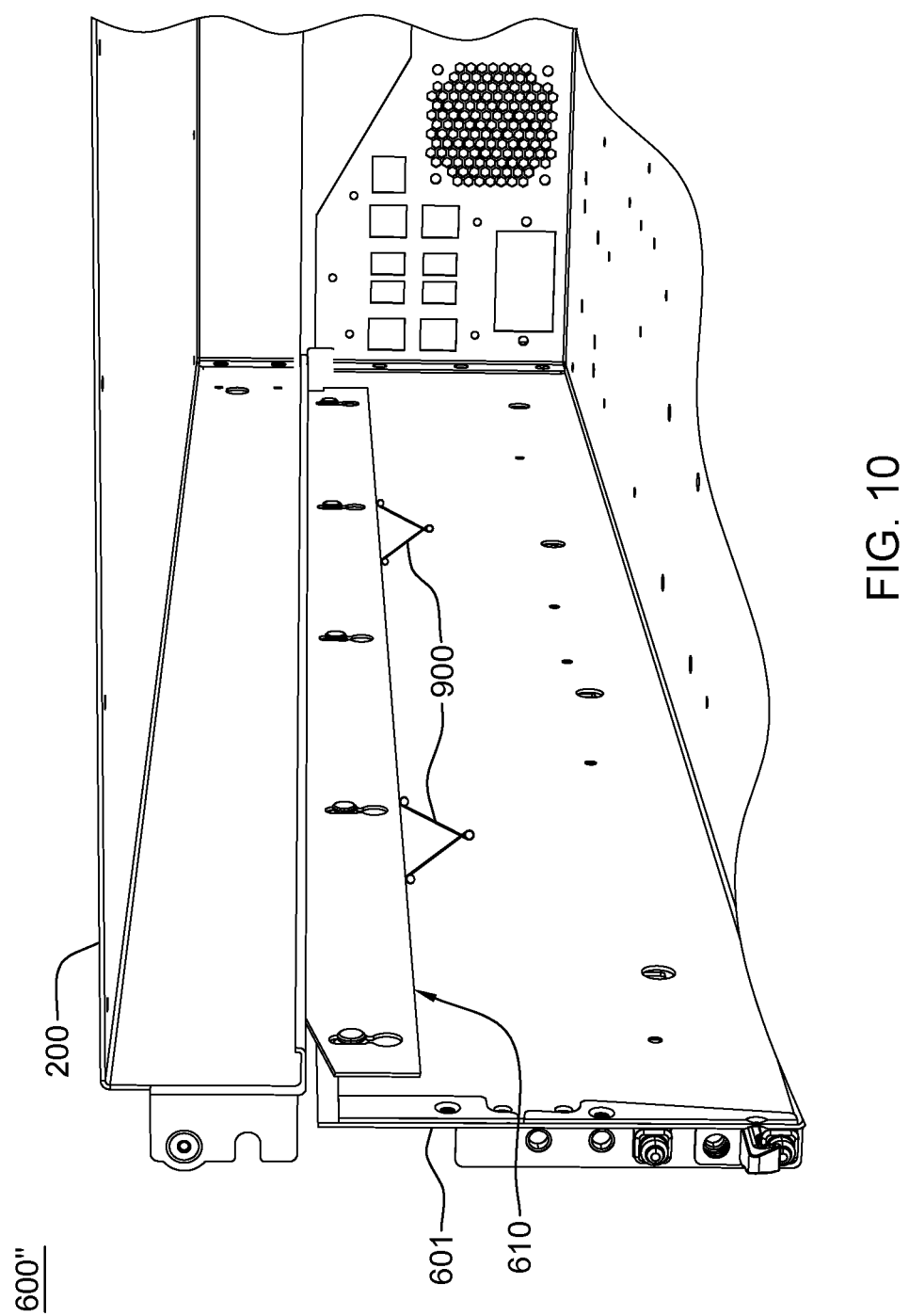
FIG. 10 depicts a further embodiment of a rack-mountable assembly, in accordance with one or more aspects of the present invention.

FIG. 10 depicts a further variation of a rack-mountable assembly 600", in accordance with one or more aspects of the present invention. In this embodiment, rack-mountable assembly 600" is similar to the rack-mountable assemblies described above, with the exception that electromagnetic shielding structure 610 of the assembly is slidably coupled to the sidewall of the drawer to extend upward from the drawer, with an edge of the cover 200 being in contact with electromagnetic shielding structure 610 as the drawer 601 is slid into operative position within the electronics rack adjacent to the cover. Spring-biasing 900 is coupled to electromagnetic shielding structure 610 to facilitate extending electromagnetic shielding structure 610 from drawer 601 into contact with the edge of the cover 200 as drawer 601 slides into operative position within the electronics rack. Note that the spring-biasing 900 in the embodiment of FIG. 10 is designed to be sufficient to overcome gravitational force on the electromagnetic shielding structure 610, and to provide the desired upward force on the electromagnetic shielding structure to maintain contact with the sidewall edge of cover 200 when the rack-mountable assembly is operatively positioned within the electronics rack to, for instance, provide both an electromagnetic compatibility and airflow seal across the gap between the cover and drawer, as well as to account for any potentially angular misalignment between the two sliding contact surfaces.

Those skilled in the art will note from the description provided herein that the electromagnetic shielding structure can be configured in any desired shape and size to operate as described herein. In one embodiment, a first electromagnetic shielding structure is coupled to a first sidewall of a rigid top cover by a set of pin-slot connections, and a second electromagnetic shielding structure is coupled to a second sidewall of the rigid top cover via another set of pin-slot connections. In one or more implementations, each electromagnetic shielding structure includes an electromagnetic shielding plate which is sized and configured with a weight sufficient for gravity to maintain contact between the electromagnetic shielding structure and the slidable drawer as the drawer is slid into operative position within the electronics rack. Spring-biasing can be provided in association with the guide pins in order to ensure a slidable coupling of the electromagnetic shielding plate to the cover, thereby allowing gravitational force to maintain the uniform contact between the electromagnetic shielding structure and drawer, as described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A rack-mountable assembly comprising:
   a cover configured to fixedly mount to a frame of an electronics rack;
   a drawer configured to slidably mount to the frame of the electronics rack adjacent to the cover to slide relative to the cover, wherein when operatively positioned within the electronics rack, the cover and drawer together define an enclosure to enclose one or more electronic components; and
   an electromagnetic shielding structure to provide, at least in part, electromagnetic shielding at a gap between the cover and drawer when the cover and drawer are operatively positioned within the electronics rack, the electromagnetic shielding structure comprising an electromagnetic shielding plate, the electromagnetic shielding plate overlying, at least in part, the gap between the cover and the drawer, and self-adjusting with sliding of the drawer into the electronics rack to facilitate providing the electromagnetic shielding at the gap between the cover and the drawer.

2. The rack-mountable assembly of claim 1, wherein the electromagnetic shielding structure is slidably coupled to the cover to depend from the cover, and is sized and configured so that an edge of the drawer contacts the electromagnetic shielding structure as the drawer is slid into operative position within the electronics rack.

3. The rack-mountable assembly of claim 2, wherein the electromagnetic shielding plate includes multiple slots, and the cover includes multiple guide pins which extend through the multiple slots to slidably couple the electromagnetic shielding plate to the cover.

4. The rack-mountable assembly of claim 3, wherein a guide pin of the multiple guide pins is spring-biased out from the cover to loosely couple the electromagnetic shielding plate to the cover, and thereby facilitate the electromagnetic shielding plate extending downward from the cover due to gravity when the cover is fixedly mounted to the frame of the electronics rack.

5. The rack-mountable assembly of claim 3, wherein the enclosure defined by the cover and drawer when operatively positioned within the electronics rack is substantially sealed at the gap between the cover and drawer by the electromagnetic shielding structure, and the electromagnetic shielding plate being a rigid structure operating as an air-gasket to block airflow at the gap between the cover and the drawer, along at least a side of the drawer, when operatively positioned within the electronics rack.

6. The rack-mountable assembly of claim 3, wherein the electromagnetic shielding structure includes a contact element disposed along an edge of the electromagnetic shielding plate to contact the edge of the drawer with sliding of the drawer into operative position within the electronics rack, the contact element being formed of a conductive material to facilitate providing the electromagnetic shielding at the gap between the cover and the drawer when operatively positioned within the electronics rack.

7. The rack-mountable assembly of claim 6, wherein the contact element is a wave-patterned element disposed along the edge of the electromagnetic shielding plate, and is configured to facilitate contacting the edge of the drawer when the drawer is slid into operative position within the electronics rack.

8. The rack-mountable assembly of claim 2, further comprising multiple electromagnetic shielding structures, the electromagnetic shielding structure being one electromagnetic shielding structure of the multiple electromagnetic shielding structures, and wherein the cover comprises a first side and a second side, a first electromagnetic shielding structure of the multiple electromagnetic shielding structures being slidably coupled to the first side of the cover, and a second electromagnetic shielding structure of the multiple electromagnetic shielding structures being slidably coupled to the second side of the cover.

9. The rack-mountable assembly of claim 8, wherein the first electromagnetic shielding structure comprises a first electromagnetic shielding plate with multiple slots, and the second electromagnetic shielding structure comprises a second electromagnetic shielding plate with multiple slots, and wherein the cover includes multiple guide pins which extend through the multiple slots of the first and second electromagnetic shielding plates to slidably couple the first and second electromagnetic shielding plates to the cover.

10. The rack-mountable assembly of claim 2, further comprising spring-biasing coupled to the electromagnetic shielding structure to facilitate extending the electromagnetic shielding structure downward from the cover so that the electromagnetic shielding structure is contacted by the edge of the drawer and self-adjusts with sliding of the drawer into operative position within the electronics rack adjacent to the cover.

11. The rack-mountable assembly of claim 1, wherein the electromagnetic shielding structure is slidably coupled to the drawer to extend from the drawer, and an edge of the cover is in contact with the electromagnetic shielding structure as the drawer is slid into operative position within the electronics rack adjacent to the cover, and wherein spring-biasing is coupled to the electromagnetic shielding structure to facilitate extending the electromagnetic shielding structure from the drawer to contact with edge of the cover as the drawer slides into operative position within the electronics rack.

12. The rack-mountable assembly of claim 1, wherein the electromagnetic shielding plate self-adjusts in a direction substantially transverse to a sliding direction of the drawer into the frame to facilitate providing the electromagnetic shielding at the gap between the cover and the drawer when operatively positioned within the electronics rack.

13. An apparatus comprising:
    an electronics rack comprising a frame;
    a rack-mounted assembly comprising:
       a cover fixedly mounted to the frame of the electronics rack;
       a drawer slidably coupled to the frame of the electronics rack adjacent to the cover to slide relative to the cover, wherein the cover and drawer together define an enclosure to enclose one or more electronic components; and an electromagnetic shielding structure providing, at least in part, electromagnetic shielding at a gap between the cover and drawer when operatively positioned within the electronics rack, the electromagnetic shielding structure comprising an electromagnetic shielding plate, the electromagnetic shielding plate overlying, at least in part, the gap between the cover and the drawer, and self-adjusting with sliding of the drawer into the electronics rack to facilitate providing the electromagnetic shielding at the gap between the cover and the drawer.

14. The apparatus of claim 13, wherein the electromagnetic shielding structure is slidably coupled to the cover to depend from the cover, and is sized and configured so that an edge of the drawer contacts the electromagnetic shielding structure as the drawer is slid into operative position relative to the cover.

15. The apparatus of claim 14, wherein the electromagnetic shielding plate includes multiple slots, and the cover includes multiple guide pins which extend through the multiple slots to slidably couple the electromagnetic shielding plate to the cover.

16. The apparatus of claim 15, wherein a guide pin of the multiple guide pins is spring-biased out from the cover to loosely couple the electromagnetic shielding plate to the cover, and thereby facilitate the electromagnetic shielding plate extending downward from the cover due to gravity.

17. The apparatus of claim 15, wherein the enclosure defined by the cover and drawer is substantially sealed at the gap between the cover and drawer by the electromagnetic shielding structure, the electromagnetic shielding plate being a rigid structure operating as an air-gasket to block airflow at the gap between the cover and the drawer, along at least a side of the drawer.

18. The apparatus of claim 15, wherein the electromagnetic shielding structure includes a contact element disposed along an edge of the electromagnetic shielding plate to contact the edge of the drawer with sliding of the drawer into operative position within the electronics rack, the contact element being formed of a conductive material to facilitate providing the electromagnetic shielding at the gap between the cover and the drawer, and wherein the contact element is a wave-patterned element disposed along the edge of the electromagnetic shielding plate, and is configured to facilitate contacting the edge of the drawer when the drawer is slid into operative position within the electronics rack.

19. The apparatus of claim 13, wherein the electromagnetic shielding plate self-adjusts in a direction substantially transverse to a sliding direction of the drawer into the frame to facilitate providing the electromagnetic shielding at the gap between the cover and the drawer when operatively positioned within the electronics rack.

20. A method comprising:
providing a rack-mountable assembly for an electronics rack, the providing comprising:
providing a cover configured to fixedly mount to a frame of the electronics rack;
providing a drawer configured to mount to the frame of the electronics rack adjacent to the cover to slide relative to the cover, wherein when operatively positioned within the electronics rack, the cover and drawer together define an enclosure to enclose one or more electronic components; and
providing an electromagnetic shielding structure to provide, at least in part, electromagnetic shielding at a gap between the cover and drawer when the cover and drawer are operatively positioned within the electronics rack, the electromagnetic shielding structure comprising an electromagnetic shielding plate, the electromagnetic shielding plate overlying, at least in part, the gap between the cover and the drawer, and self-adjusting with sliding of the drawer into the electronics rack to facilitate providing the electromagnetic shielding at the gap between the cover and the drawer.

* * * * *